(12) United States Patent
Tsuji et al.

(10) Patent No.: US 8,053,765 B2
(45) Date of Patent: Nov. 8, 2011

(54) ORGANIC ELECTROLUMINESCENT ELEMENT, DISPLAY DEVICE AND LIGHTING DEVICE

(75) Inventors: Aki Tsuji, Tokyo (JP); Hiroshi Kita, Tokyo (JP); Yoshiyuki Suzuri, Tokyo (JP)

(73) Assignee: Konica Minolta Holdings, Inc. (JP)

( * ) Notice: Subject to any disclaimer, the term of this patent is extended or adjusted under 35 U.S.C. 154(b) by 257 days.

(21) Appl. No.: 12/092,495

(22) PCT Filed: Nov. 7, 2006

(86) PCT No.: PCT/JP2006/322142
§ 371 (c)(1),
(2), (4) Date: May 2, 2008

(87) PCT Pub. No.: WO2007/055186
PCT Pub. Date: May 18, 2007

(65) Prior Publication Data
US 2010/0295026 A1 Nov. 25, 2010

(30) Foreign Application Priority Data
Nov. 9, 2005 (JP) .............................. JP2006-324598

(51) Int. Cl.
*H01L 35/24* (2006.01)
(52) U.S. Cl. ............ 257/40; 257/79; 257/102; 257/642; 257/E51.001
(58) Field of Classification Search .................. 257/40, 257/79, 89, 98, 102, 451, 642
See application file for complete search history.

(56) References Cited

U.S. PATENT DOCUMENTS

| | | | |
|---|---|---|---|
| 6,097,147 A | 8/2000 | Baldo et al. | |
| 6,555,840 B1* | 4/2003 | Hudson et al. | 257/40 |
| 2004/0155238 A1* | 8/2004 | Thompson et al. | 257/40 |
| 2006/0273714 A1* | 12/2006 | Forrest et al. | 313/504 |

FOREIGN PATENT DOCUMENTS

| | | | |
|---|---|---|---|
| JP | 63-264692 A | 11/1988 | |
| JP | 3-255190 A | 11/1991 | |
| JP | 4-297076 A | 10/1992 | |
| JP | 7-142169 A | 6/1995 | |
| JP | 3-093796 A | 7/2000 | |
| JP | 2000-196140 A | 7/2000 | |
| JP | 2001-244079 A | 9/2001 | |
| JP | 2001-313180 A | 11/2001 | |
| JP | 2003-187977 A | 7/2003 | |
| JP | 2004-63349 A | 2/2004 | |
| JP | 2004-227814 A | 8/2004 | |
| JP | 2005-53912 A | 3/2005 | |
| JP | 2005-276583 A | 10/2005 | |
| JP | 2006-172763 A | 6/2006 | |

OTHER PUBLICATIONS

International Search Report for International Application No. PCT/JP2006/322142 mailed Feb. 6, 2007.

* cited by examiner

*Primary Examiner* — Wai Sing Louie
(74) *Attorney, Agent, or Firm* — Cantor Colburn LLP

(57) ABSTRACT

Disclosed is an organic electroluminescent element containing organic layers sandwiched between an anode and a cathode, wherein the organic layers incorporates an emission layer A containing a host compound A and at least two types of emission dopants, and an emission layer B containing a host compound B and at least one type of emission dopant, provided that at least one of the emission dopants contained in the emission layer A is a phosphorescence-emitting material.

19 Claims, 3 Drawing Sheets

LIGHT

ORGANIC ELECTROLUMINESCENT ELEMENT, DISPLAY DEVICE AND LIGHTING DEVICE

CROSS REFERENCE TO RELATED APPLICATIONS

This is a U.S. national stage of application No. PCT/JP2006/322142, filed on 7 Nov. 2006. Priority under 35 U.S.C. §119(a) and 35 U.S.C. §365(b) is claimed from Japanese Application No. 2005-324598, filed 9 Nov. 2005, the disclosure of which is also incorporated herein by reference.

TECHNICAL FIELD

The present invention relates to an organic electroluminescent element, a display device and a lighting device.

BACKGROUND OF ART

Conventionally, an emission type electronic display device includes an electroluminescence display (hereinafter, referred to as an ELD). A constituent element of ELD includes such as an inorganic electroluminescent element and an organic electroluminescent element (hereinafter, referred to as an organic EL element).

An inorganic electroluminescent element has been utilized as a flat light source, however, requires a high voltage of alternating current to operate an emission element.

On the other hand, an organic electroluminescent element is an element provided with a constitution comprising an emission layer containing a emitting substance being sandwiched with a cathode and an anode, and an exciton is generated by an electron and a positive hole being injected into the emission layer to be recombined, resulting emission utilizing light release (fluorescence•phosphorescence) at the time of deactivation of said exciton; the emission is possible at a voltage of approximately a few to a few tens volts, and an organic electroluminescent element is attracting attention with respect to such as superior viewing angle and high visual recognition due to a self-emission type as well as space saving and portability due to a completely solid element of a thin layer type.

In an organic electroluminescence in view of the future practical application, desired has been development of an organic EL element which efficiently emits at a high luminance with a low electric consumption. Examples of such technologies are a slight amount of a fluorescent substance doped in a stilbene derivative, distyrylarylene derivative or a tristyrylarylene derivative, to achieve improved emission luminance and a prolonged lifetime of an element (for example, refer to Patent Document No. 1). Further, there are known such as an element having an organic emission layer comprising a 8-hydroxyquinoline aluminum complex as a host compound which is doped with a slight amount of a fluorescent substance (for example, refer to Patent Document No. 2). and an element having an organic emission layer comprising a 8-hydroxyquinoline aluminum complex as a host compound which is doped with quinacridone type dye (for example, refer to Patent Document No. 3).

Regarding to the technologies disclosed in the above-described Patent Documents, when emission from an excited singlet is utilized, since a generation ratio of a singlet exciton to a triplet exciton is 1/3, that is, a generation probability of an emitting exciton species is 25% and a light taking out efficiency is approximately 20%, the limit of a quantum efficiency (next) of taking out is said to be 5%.

However, since an organic EL element which utilizes phosphorescence from an excited triplet has been reported from Princeton University (for example, refer to Non Patent Document 1), researches on materials exhibiting phosphorescence at room temperature have come to be active (for example, refer to Non Patent Document No. 2 and Patent Document No. 4).

Since the upper limit of internal quantum efficiency becomes 100% by utilization of an excited triplet, which is principally 4 times of the case of an excited singlet, it may be possible to achieve almost the same ability as a cooled cathode ray tube to attract attention also for an illumination application.

For example, many compounds mainly belonging to heavy metal complexes such as iridium complexes have been synthesized and studied (for example, refer to Non Patent Document No. 3). Further, utilization of tris(2-phenylpyridine) iridium as a dopant has been studied (for example, refer to Non Patent Document No. 2).

In addition to these, there have been studied to use $L_2Ir$ (acac) such as $(ppy)_2Ir(acac)$ as a dopant (for example, refer to Non Patent Document No. 4). Also there have been studied to use compounds such as tris(2-(p-tolyl)pyridine) iridium $(Ir(ptpy)_3)$ and tris(benzo[h]quinoline)iridium $(Ir(bzg)_3)$, $Ir(bzq)_2$ $CIP(Bu)_3$ (for example, refer to Non Patent Document No. 5).

Further, to obtain high emission efficiency, a hole transporting compound is known to use as a host of a phosphorescent compound (for example, refer to Non Patent Document No. 6). Further, various types of electron transporting materials have been used as a host of a phosphorescent compound doped with a new iridium complex for example, refer to Non Patent Document No. 4). In addition, a high emission efficiency has been achieved by introduction of a hole block layer (for example, refer to Non Patent Document No. 5).

Over recent years, there has been proposed a method of enhancing the conductivity of an organic layer by increasing the carrier concentration in a positive hole transport layer and in an electron transport layer which are in thermal equilibrium, wherein acceptors are doped in the positive hole transport layer and donors are doped in the electron transport layer (refer, for example, to Patent Documents 5 and 6).

Further, there have been proposed an organic electroluminescent element incorporating a donor-doped electron transport layer and a positive hole inhibition layer which efficiently traps positive holes, as well as an organic electroluminescent element incorporating an acceptor-doped positive hole transport layer and an electron inhibition layer which efficiently traps electrons, resulting in an organic electroluminescent element featuring a constitution which excels in electro-optic characteristics exhibiting further enhanced emission efficiency (refer, for example, to Patent Document 7).

An organic EL element is further characterized by exhibiting extensive color variations, and is also characterized by emitting light of various colors by color mixing in combinations of plural emission colors.

Of the emission colors, in particular, white color emission is highly demanded, which can also be utilized as a backlight for a display device. Further, white color emission is separable into blue, green, and red pixels using appropriate color filters.

As such a method for emitting white light, the following two methods are applicable.

(a) Plural emission compounds are doped in one emission layer.

(b) Plural emission colors from plural emission layers are combined.

For example, in cases in which white color is formed using the three colors of blue (B), green (G), and red (R), with regard to method 1, a four-way deposition for B, G, and R light emission materials as well as for a host compound is required, provided that a vacuum deposition method is employed as an element production method. However, there is much difficulty in controlling the four-way deposition.

Further, although there is a method of coating B, G, and R light emission materials as well as a host compound after dissolving the same in a solvent or dispersing the same, there has, so far, been the continuing problem that a coating type organic EL element is inferior in layer durability to a deposition type.

In contrast, a method of combining plural emission layers, described in method 2, has been proposed. In cases when employing the deposition type organic EL element, method 2 is more readily employed than method 1.

With regard to such an organic EL element emitting white light, an attempt to obtain white light emission by color mixing using both of the following emission layers has been proposed, wherein the emission layers are formed via lamination of appropriate layers, which are a blue light emission layer for short wavelength emission and a yellow light emission layer for long wavelength emission (refer, for example, to Patent Document 8).

However, in an organic EL element formed via lamination of these two emission layers which each emit different colors (namely each featuring different peak wavelengths), the emission center is likely to shift due to variations in the layer quality of the two emission layers or in transportability of holes (positive holes) and electrons, according to variations in the driving duration of the element, that is, variations in the emission duration or in the applied voltage, whereby chromaticity variation tends to occur.

Specifically, when white color is formed by color mixing using the two emission layers, white color is sensitive to chromaticity variation, compared with the other colors, resulting in the above problem.

In an organic EL element featuring mixed color emission from plural emission layers each of which has a different peak wavelength, those formed by alternately laminating at least three layers, which each emit light at different peak wavelengths, have been disclosed as a method of inhibiting, as much as possible, the chromaticity variation due to the driving duration variation or the voltage variation (refer, for example, to Patent Document 9).

Further, in a laminated structure of at least two layers, a method of designing the layer thickness of the emission layer and the ratio of an organic host material and a fluorescent material, as parameters, has been disclosed (refer, for example, to Patent Document 10).

Alternate types of lamination thereof make it possible to realize a preventive effect of chromaticity shift even when the carrier injection balance slightly varies. However, due to poor emission efficiency and the occurrence of interlayer energy transfer, uneven distribution of whiteness is noted, resulting in inferior white light emission.

Patent Document 1: Japanese Patent Publication No. 3093796 specification

Patent Document 2: Unexamined Japanese Patent Application Publication (hereinafter referred to as JP-A) No. 63-264692

Patent Document 3: JP-A No. 3-255190
Patent Document 4: U.S. Pat. No. 6,097,147 specification
Patent Document 5: JP-A No. 4-297076
Patent Document 6: JP-A No. 2001-244079
Patent Document 7: JP-A No. 2000-196140
Patent Document 8: JP-A No. 7-142169
Patent Document 9: JP-A No. 2003-187977
Patent Document 10: JP-A No. 2004-63349
Non-Patent Document 1: M. A. Baldo et al., Nature, Vol. 395, pages 151-154 (1998)
Non-Patent Document 2: M. A. Baldo et al., Nature, Vol. 403, No. 17, pages 750-753 (2000)
Non-Patent Document 3: S. Lamansky et al., J. Am. Chem. Soc., Vol. 123, page 4304 (2001)
Non-Patent Document 4: M. E. Tompson et al., The 10th International Workshop on Inorganic and Organic Electroluminescence (EL' 00, Hamamatsu)
Non-Patent Document 5: Moon-Jae Youn. Og, Tetsuo Tsutsui et al., The 10th International Workshop on Inorganic and Organic Electroluminescence (EL' 00, Hamamatsu)
Non-Patent Document 6: Ikai et al., The 10th International Workshop on Inorganic and Organic Electroluminescence (EL' 00, Hamamatsu)

DISCLOSURE OF THE INVENTION

Problems to be Solved by the Invention

In view of the above problems, the present invention was achieved. An object of the present invention is to provide an organic electroluminescent element exhibiting no chromaticity shift, high emission efficiency, and a prolonged emission life, as well as a display device and a lighting device provided with the organic electroluminescent element.

Means to Solve the Problems

The object of the present invention was achieved employing the following constitutions.

1. In an organic electroluminescent element incorporating organic layers sandwiched between an anode and a cathode, an organic electroluminescent element wherein the organic layers incorporates an emission layer A containing a host compound A and at least two types of emission dopants and an emission layer B containing a host compound B and at least one type of emission dopant, provided that at least one of the emission dopants contained in the emission layer A is a phosphorescence-emitting material.

2. The organic electroluminescent element, described in item 1, wherein the emission layer B contains at least two types of emission dopants.

3. The organic electroluminescent element, described in item 1, wherein the emission layer B contains one type of emission dopant.

4. The organic electroluminescent element, described in any one of items 1-3, wherein the emission layer A contains a blue light-emitting dopant.

5. The organic electroluminescent element, described in any one of items 1-4, wherein the emission layer B is located in a position nearer to the anode than the emission layer A; and the emission layer A is located in a position nearer to the cathode than the emission layer B.

6. The organic electroluminescent element, described in any one of items 1-5, wherein the emission layer A and the emission layer B each contain the identical emission dopant.

7. The organic electroluminescent element, described in any one of items 1-6, wherein the organic layers contain at least three types of emission dopants: a blue light-emitting dopant; a green light-emitting dopant; and a red light-emitting dopant, provided that, of the three types of the emission dopants, at least two types are contained in the emission layer A and at least one type is contained in the emission layer B.

8. The organic electroluminescent element, described in any one of items 1-7, wherein the emission layer B contains a red light-emitting dopant A, and the emission layer A contains a red light-emitting dopant B and a blue light-emitting dopant A.

9. The organic electroluminescent element, described in any one of items 1-7, wherein the emission layer A contains a red light-emitting dopant and a blue light-emitting dopant and the emission layer B contains a green light-emitting dopant.

10. The organic electroluminescent element, described in any one of items 1-9, wherein the emission layer A and the emission layer B each contain an identical host compound.

11. The organic electroluminescent element, described in any one of items 1-10, wherein a non-emitting intermediate layer is arranged between the emission layer A and the emission layer B.

12. The organic electroluminescent element, described in item 11, wherein the emission layer A, the emission layer B, and the non-emitting intermediate layer each contain an identical host compound.

13. The organic electroluminescent element, described in item 11 or 12, wherein the layer thickness of the non-emitting intermediate layer is in the range of 1 nm-15 nm.

14. The organic electroluminescent element, described in any one of items 1-13, wherein a positive hole transport layer containing at least a positive hole transport material and an acceptor is incorporated as a constituent layer.

15. The organic electroluminescent element, described in any one of items 1-14, wherein an electron transport layer containing at least an electron transport material and a donor is incorporated as a constituent layer.

16. The organic electroluminescent element, described in any one of items 1-15, wherein the blue light-emitting dopant has an ionization potential (Ip) of 5.5 eV or less.

17. The organic electroluminescent element, described in any one of items 1-16, wherein the blue light-emitting dopant is a compound having a partial structure represented by Formula (1).

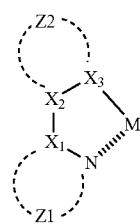

Formula (1)

wherein $X_1$, $X_2$, and $X_3$ each represent a carbon atom or a nitrogen atom; Z1 represents a group of atoms forming a 5-membered aromatic heterocycle; Z2 represents a group of atoms forming a 5-membered or 6-membered aromatic heterocycle or a 6-membered aromatic hydrocarbon ring; and M represents Ir or Pt.

18. The organic electroluminescent element, described in any one of items 1-17, wherein the organic electroluminescent element emits a white light.

19. A display device comprising the organic electroluminescent element of any one of items 1-18.

20. A lighting device comprising the organic electroluminescent element described in any one of items 1-18.

Effects of the Invention

Based on the present invention, there have been provided an organic electroluminescent element exhibiting no chromaticity shift, high emission efficiency, and a prolonged emission life, as well as a display device and a lighting device.

Figure 1:
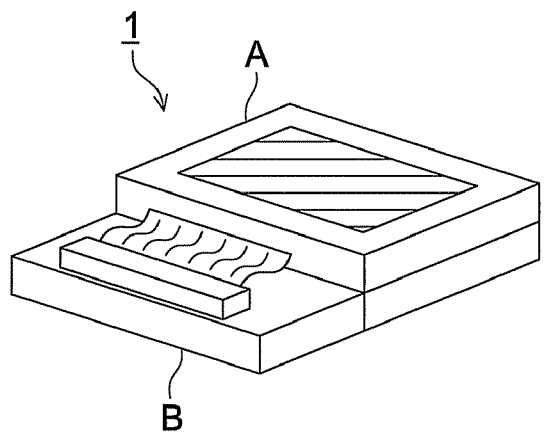
FIG. 1 is a schematic drawing to show an example of a display device constituted of an organic EL element.

DESCRIPTION OF SYMBOLS 1 display
3 pixel
5 scanning line
6 data line
7 electrical power line
10 organic EL element
11 switching transistor
12 operating transistor
13 capacitor
A display section
B control section
107 glass substrate having a transparent electrode
106 organic EL layer
105 cathode
102 glass cover
108 nitrogen gas
109 desiccant

MOST PREFERRED EMBODIMENTS TO CARRY OUT THE INVENTION

In the organic electroluminescent element (hereinafter also referred to as the organic EL element) of the present invention, via the constitution specified by any one of items 1-17, an organic electroluminescent element exhibiting no chromaticity shift, high emission efficiency, and a prolonged emission life has been provided. In addition, a display device and a lighting device, provided with the organic electroluminescent element, have been further provided.

The inventors of the present invention, as a result of diligent investigations on the above problems, have found that via an emission layer featuring a two-layer structure and also by containing two types of emission dopants in either of the two layers, chromaticity shift due to the shift of the carrier injection balance was inhibited, compared with cases in which white color was produced by color mixing using plural emission layers.

Further, since two types of emission dopants are contained in one layer, a three-way deposition together with an emission host can be employed, which is readily controllable and enables relatively easy production.

The shift of the carrier injection balance in an emission layer also tends to result in a decrease in the emission life (for example, a decrease due to excessive radical cations in an emission dopant). However, since two types of dopants are contained in the emission layer, carriers can be shared therewith, leading to prevention of the life decrease, whereby it has been found that the element exhibited a prolonged emission life. In addition, it was learned that the element, provided with a non-emitting intermediate layer, exhibited a prolonged emission life via control of carrier injection into the emission layer.

Each of the constituent elements of the present invention will now be sequentially detailed.

<<Emission Layer>>

The emission layer of the present invention is described below.

The emission layer of the present invention is a layer, which emits light via recombination of electrons and positive holes injected from an electrode or a layer such as an electron transport layer or a positive hole transport layer. The emission portion may be present either within the emission layer or at the interface between the emission layer and an adjacent layer thereof. Herein, a constituent layer of the white light-emitting organic electroluminescent element of the present invention will be detailed.

The emission layer of the organic EL element of the present invention is characterized by incorporating at least two layers composed of an emission layer A and an emission layer B, wherein the emission layer A contains a host compound to be described later and at least two types of emission dopants; the emission layer B contains a host compound A and at least one type of emission dopant; and also one of the emission dopants contained in the emission layer A is a phosphorescence-emitting material (a phosphorescence-emitting compound).

The above constitution has made it possible to decrease chromaticity shift, to increase taking-out quantum efficiency, and to prolong an emission life.

<<Host Compound (Emission Host Compound, or also Referred to Simply as Host)>>

The host compound of the present invention refers to a compound exhibiting a phosphorescence quantum yield of less than 0.01 during phosphorescence emission at room temperature (25° C.).

With regard to the host compound contained in the emission layer of the present invention, both of the emission layers A and B are preferably composed of an identical host compound, and further a non-emitting intermediate layer to be described later also preferably contains the same host compound as the emission layers A and B.

Such a constitution makes it possible to realize preferable effects as follows: to enhance interlayer adhesion, to reduce a carrier injection barrier between different layers, to decrease chromaticity shift, to prolong an emission life, and to increase taking-out quantum efficiency.

An emission host (an emission compound) used in the present invention is not specifically limited in terms of the structure, typically including a carbazole derivative, a triarylamine derivative, an aromatic borane derivative, a nitrogen-containing heterocyclic derivative, a thiophene derivative, a furan derivative, a compound having a basic skeleton such as an oligoaryrene compound, a carboline derivative or a diazacarbazole derivative (a diazacarbazole derivative indicates a derivative having a ring structure wherein at least one of the carbon atoms of a hydrocarbon ring constituting a carboline derivative is substituted with a nitrogen atom).

Of these, it is preferable to use a carbazole derivative, a furan derivative, a carboline derivative or a diazacarbazole derivative.

Specific examples of a carbazole derivative, a furan derivative, a carboline derivative or a diazacarbazole derivative are shown below. However, the present invention is not limited to them.

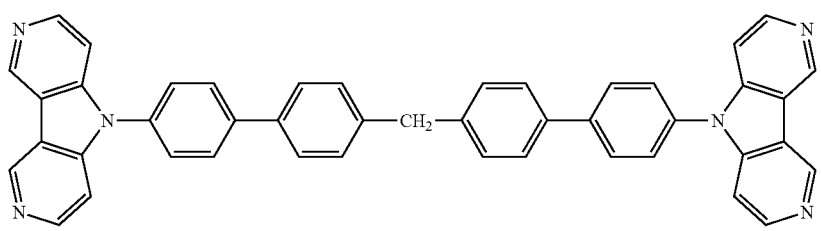

H-1

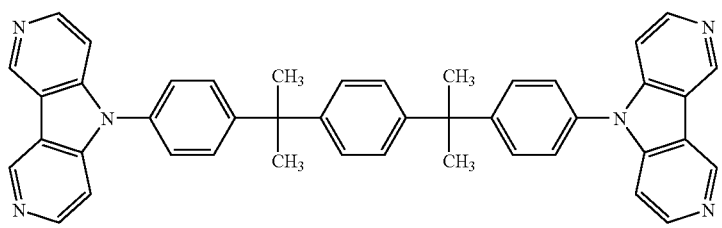

H-2

-continued
H-3
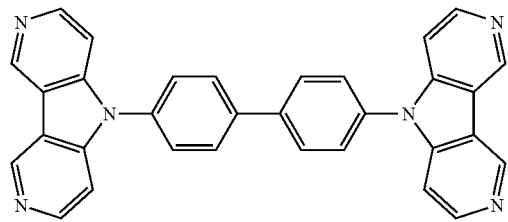
H-4
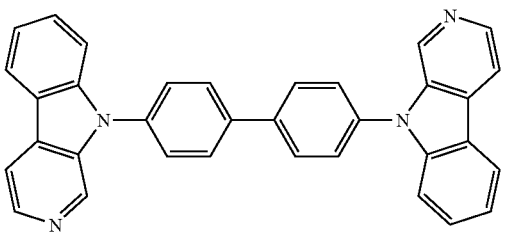
H-5
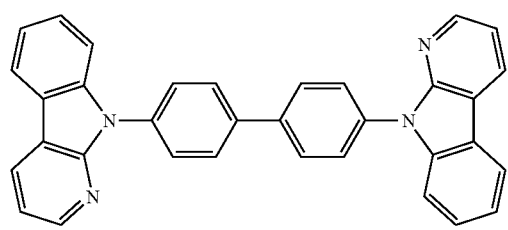
H-6
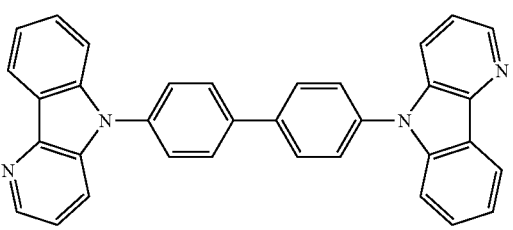
H-7
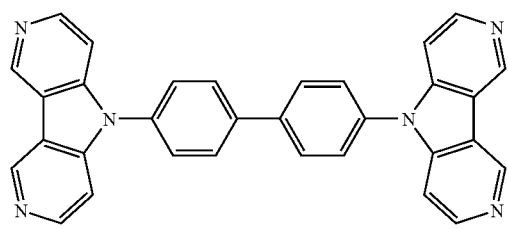
H-8
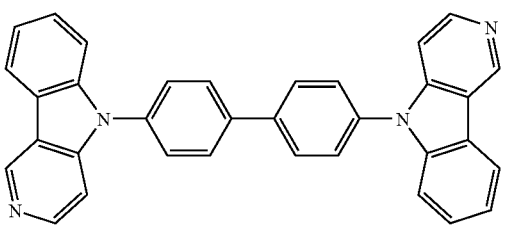
H-9
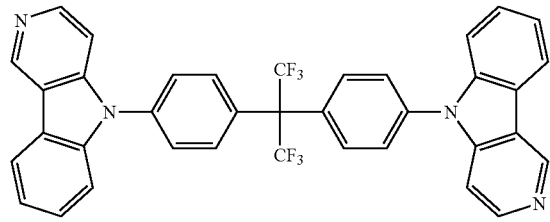
H-10
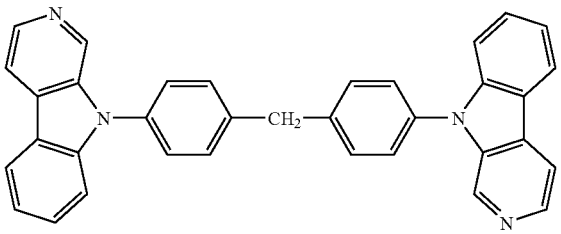
H-11
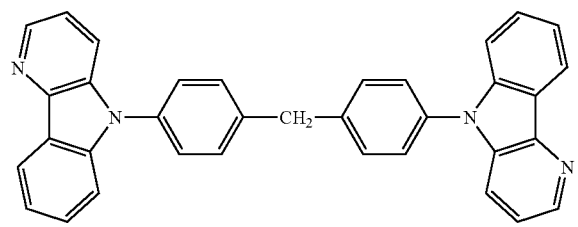
H-12
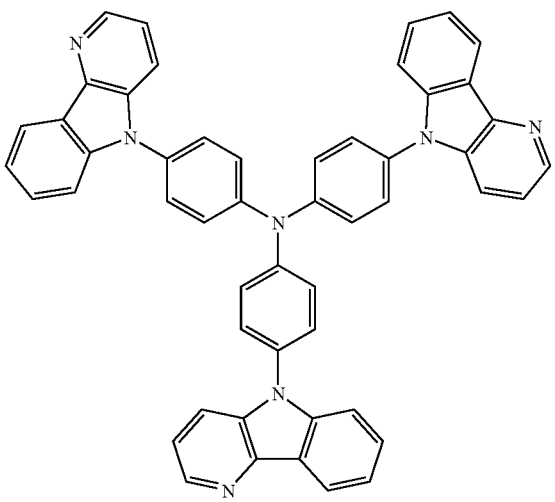

-continued
H-13
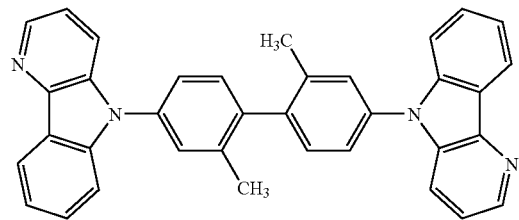
H-14
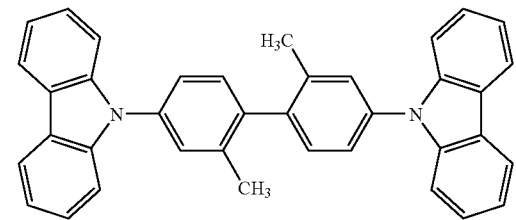
H-15
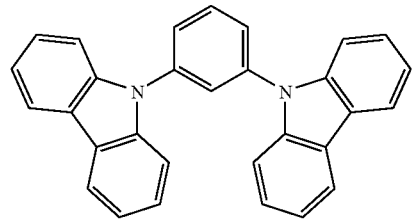
H-16
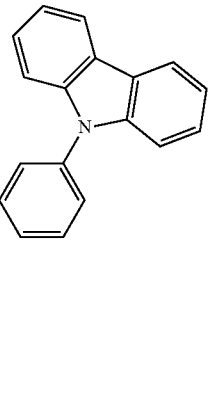
H-17
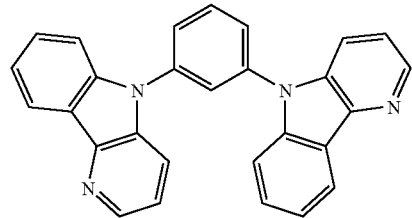
H-18
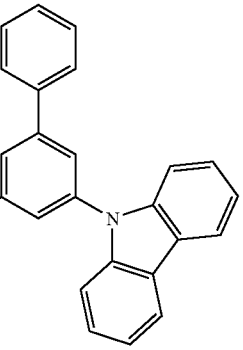
H-19
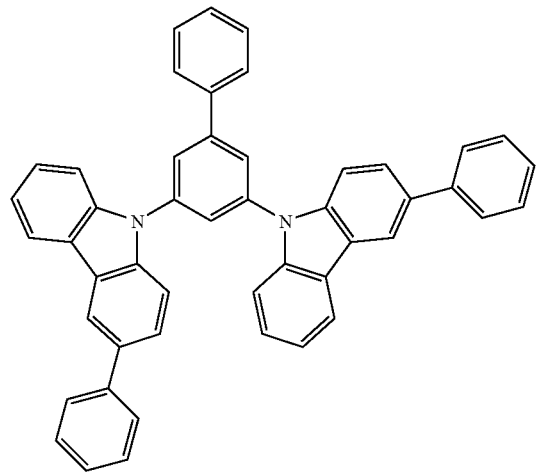

-continued
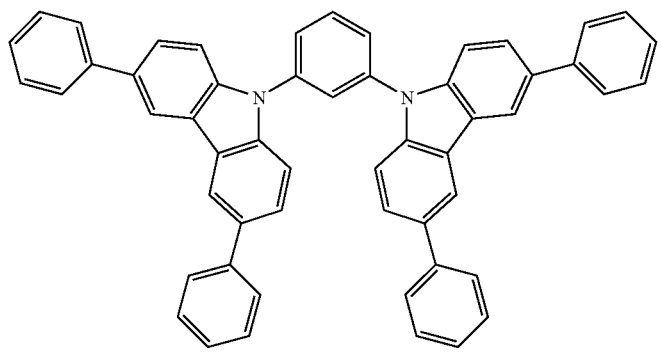
H-20
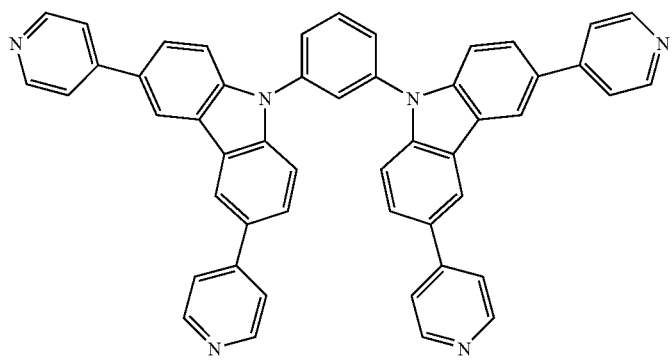
H-21
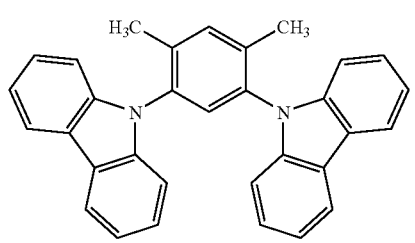
H-22
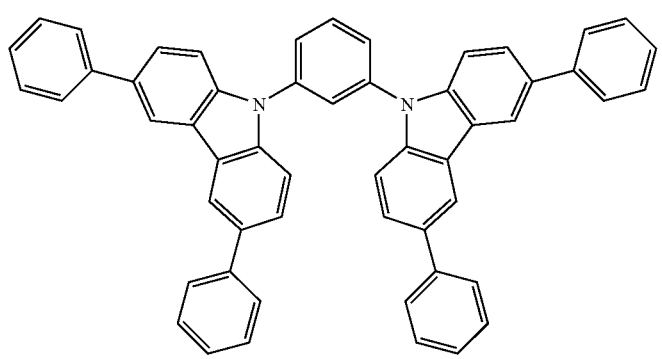
H-23

-continued
H-24
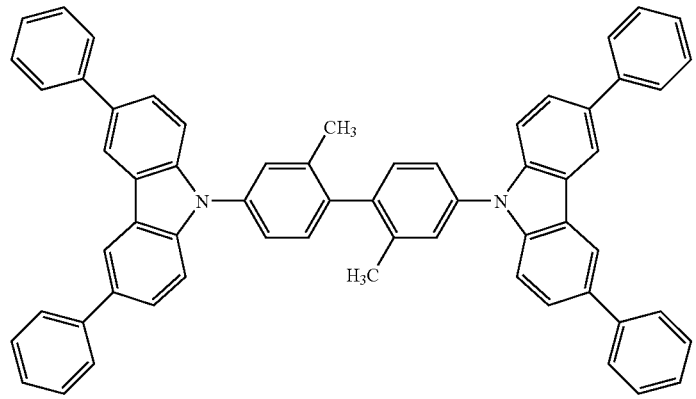
H-25
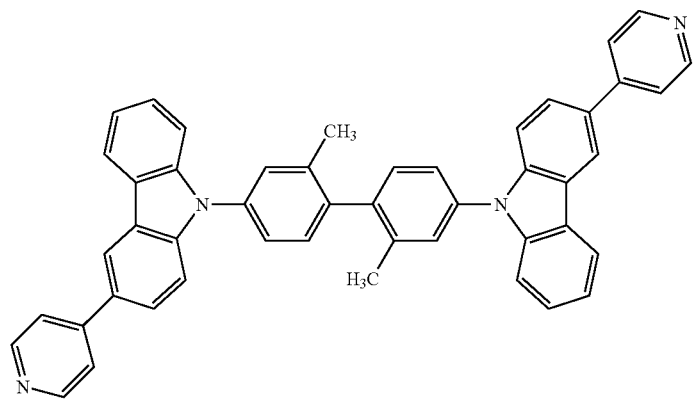
H-26
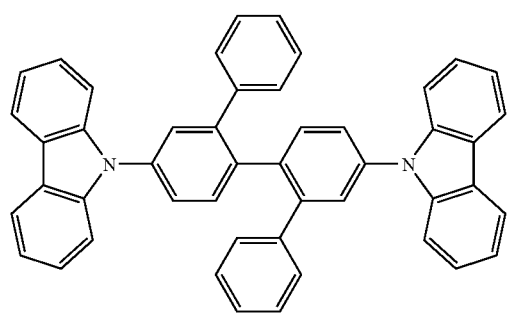
H-27
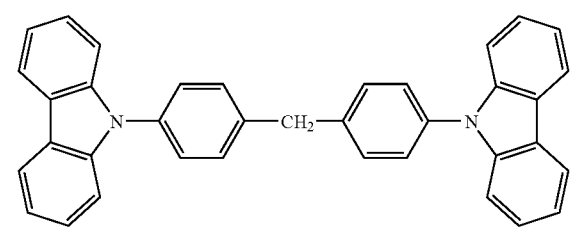
H-28
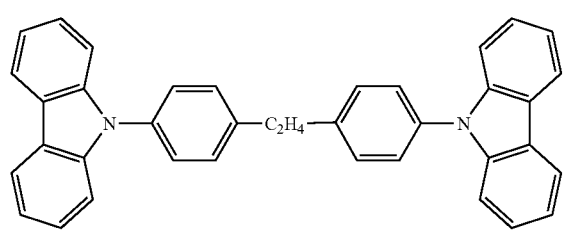
H-29
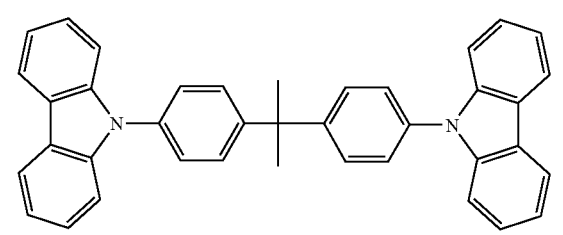
H-30
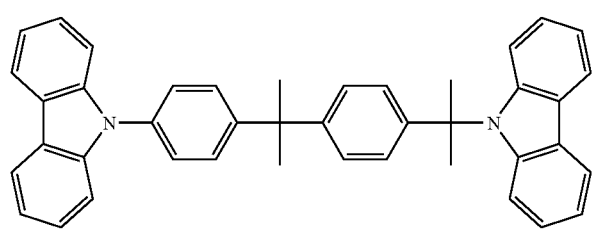

-continued
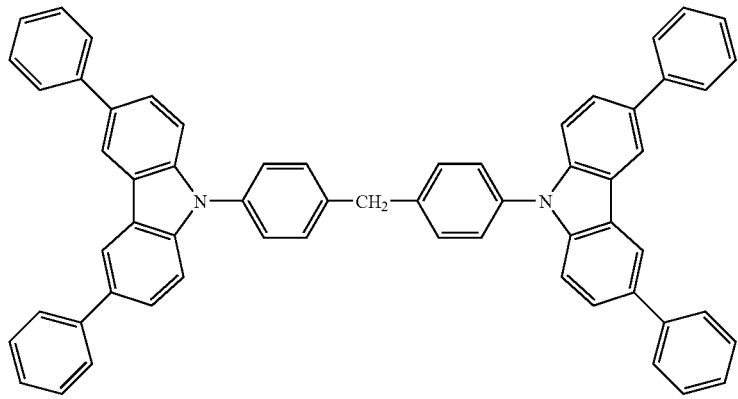
H-31
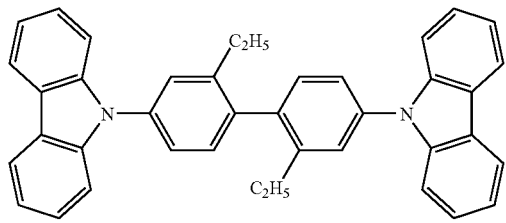
H-32
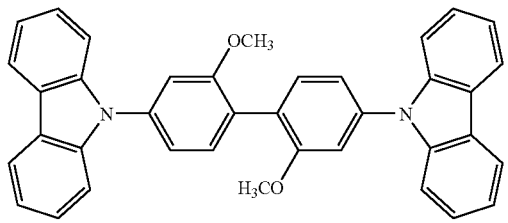
H-33
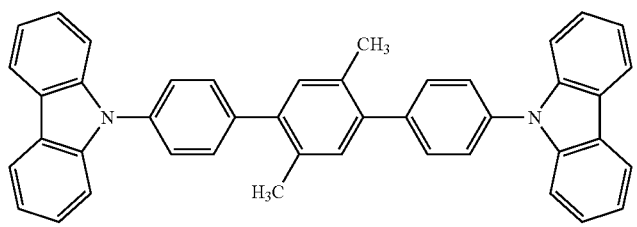
H-34
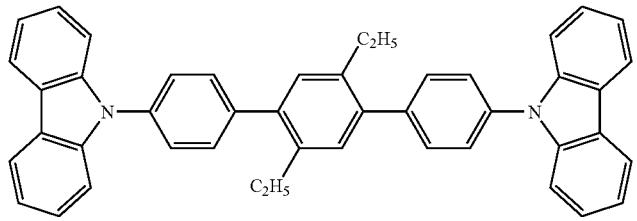
H-35
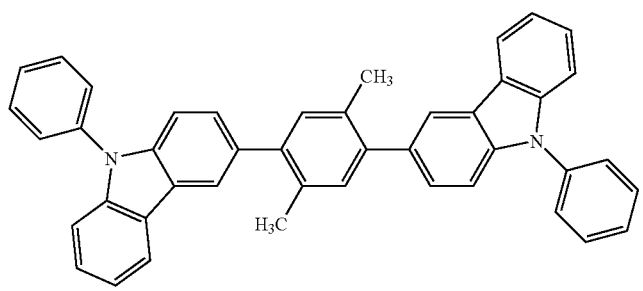
H-36

-continued
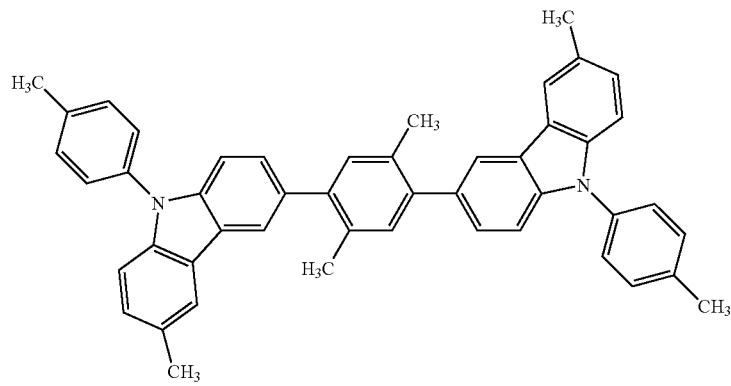
H-37
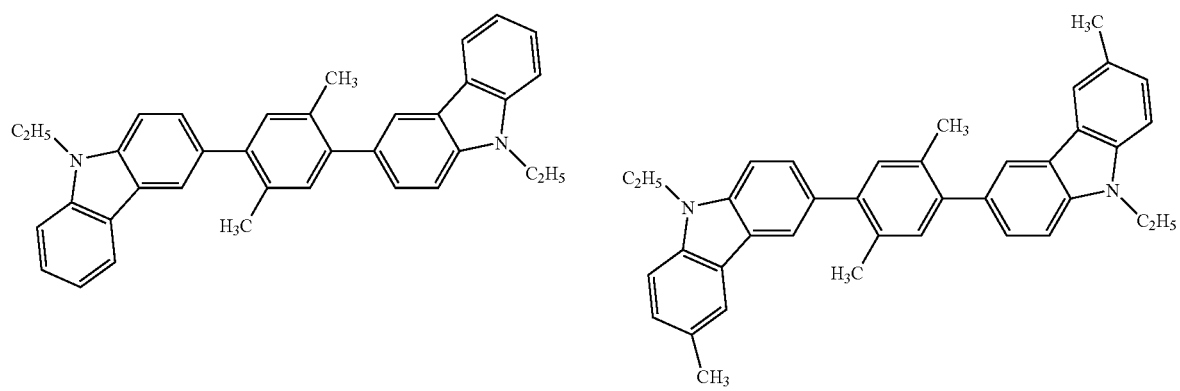
H-38
H-39
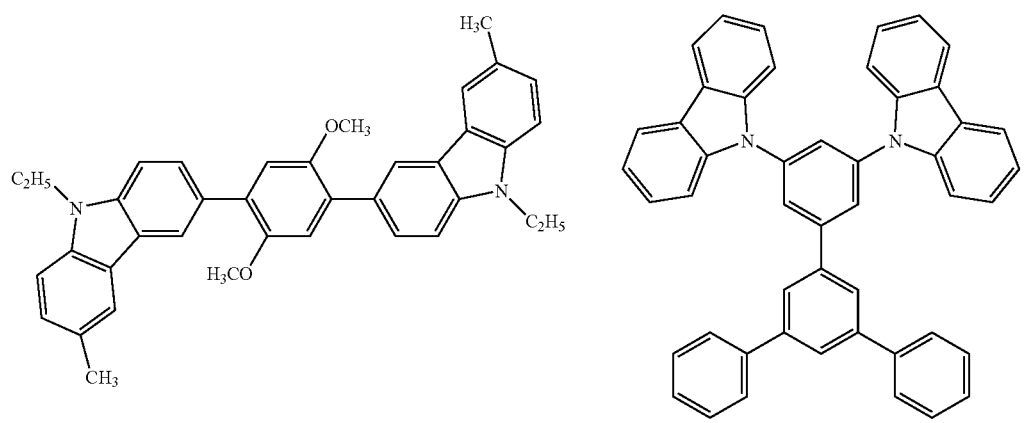
H-40
H-41

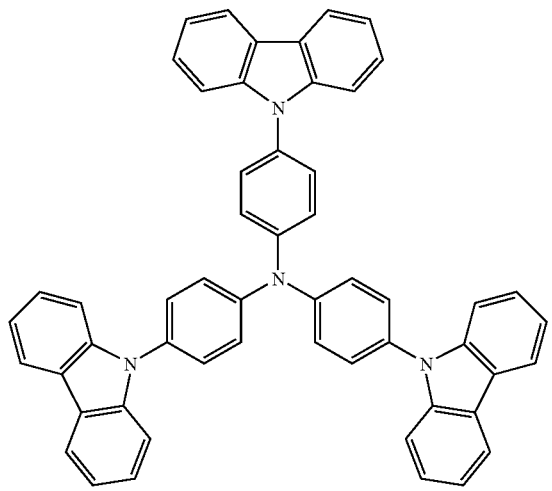
H-42
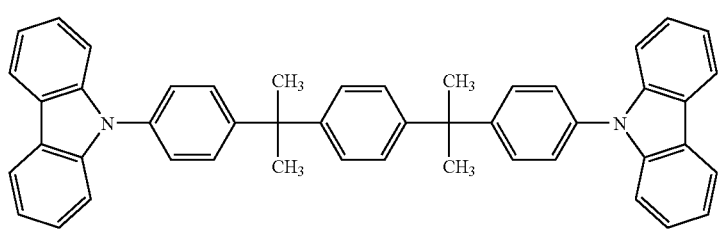
H-43
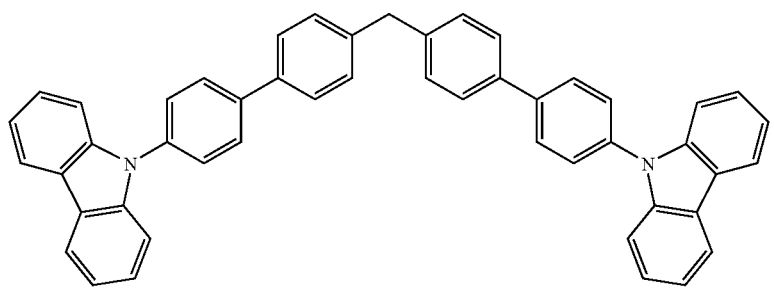
H-44
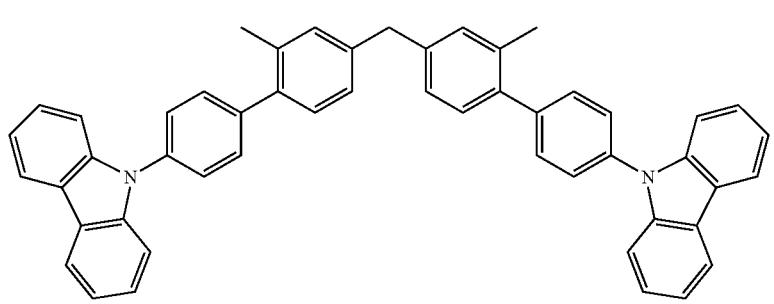
H-45

-continued
H-46
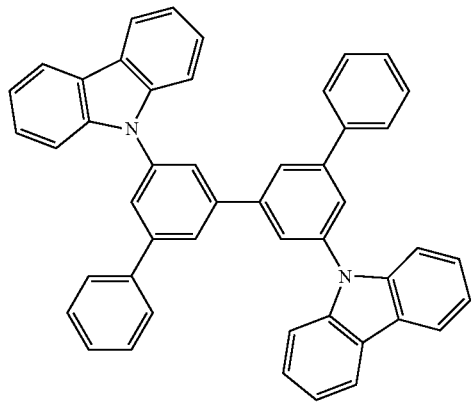
H-47
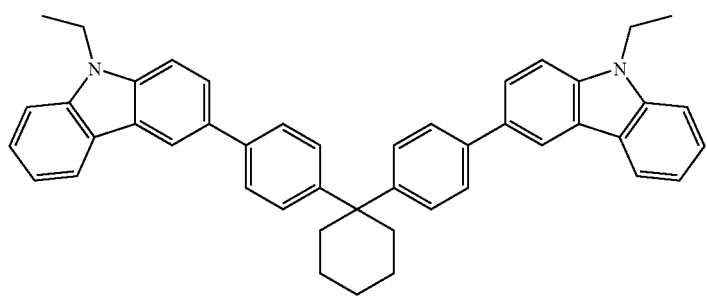
H-48
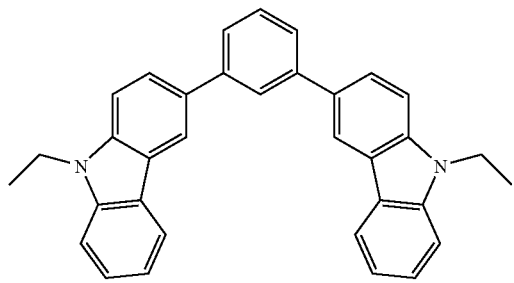
H-49
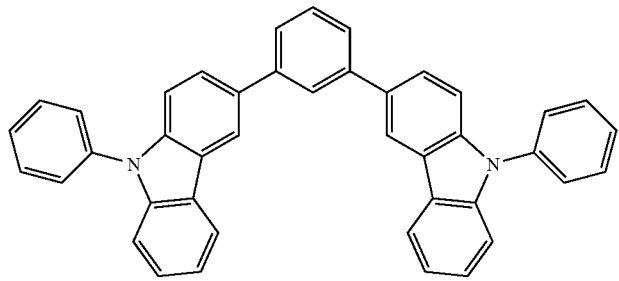
H-50
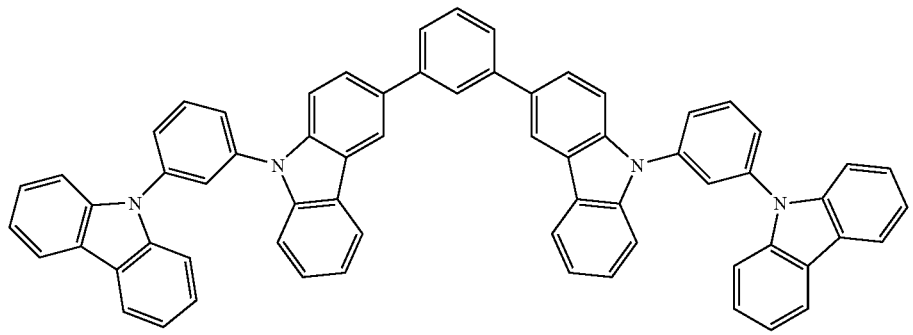

-continued
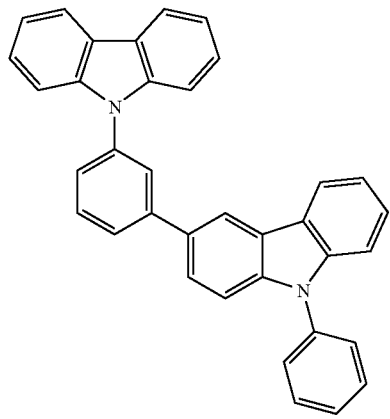
H-51
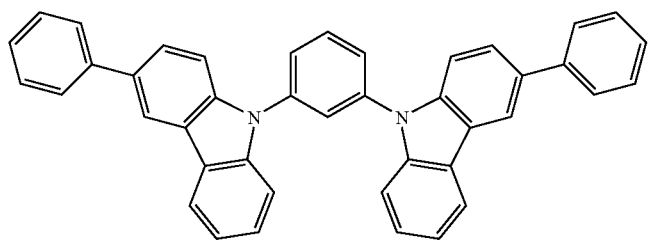
H-52
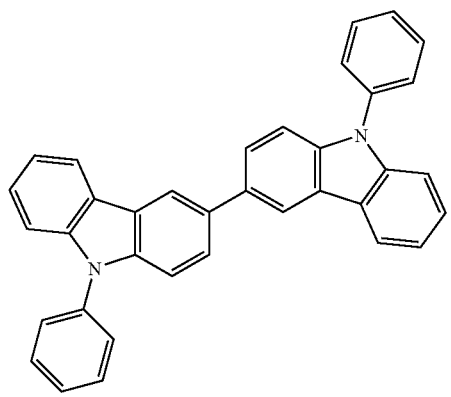
H-53
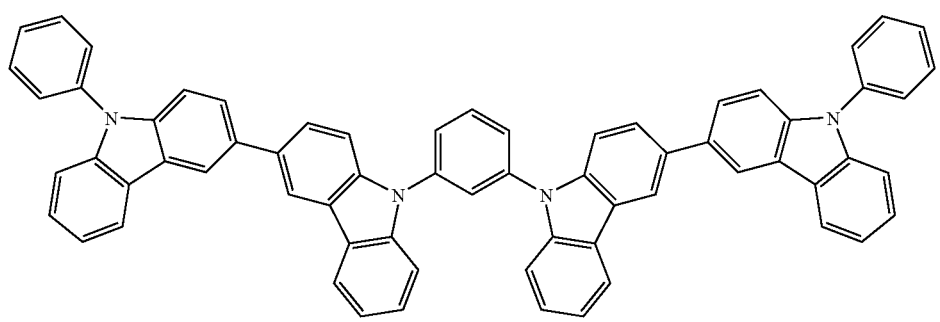
H-54
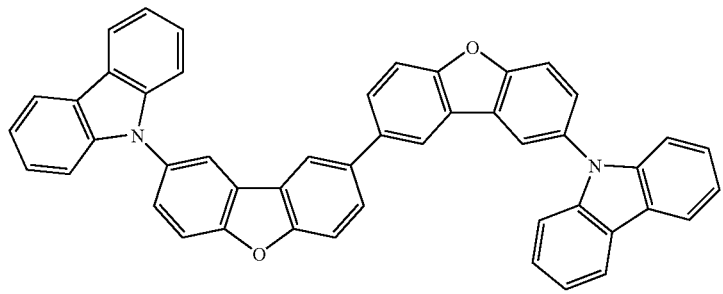
H-55

-continued
H-56
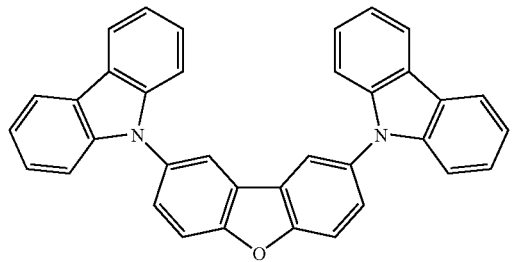
H-57
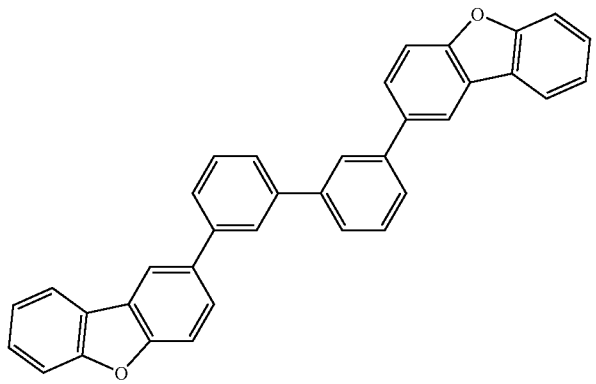
H-58
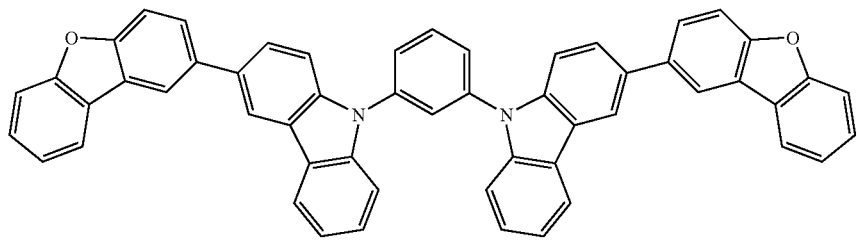
H-59
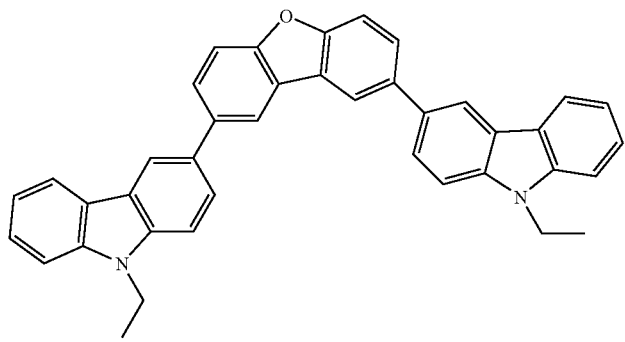
H-60
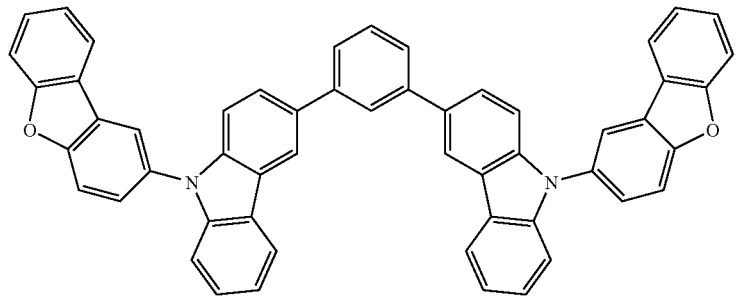
H-61
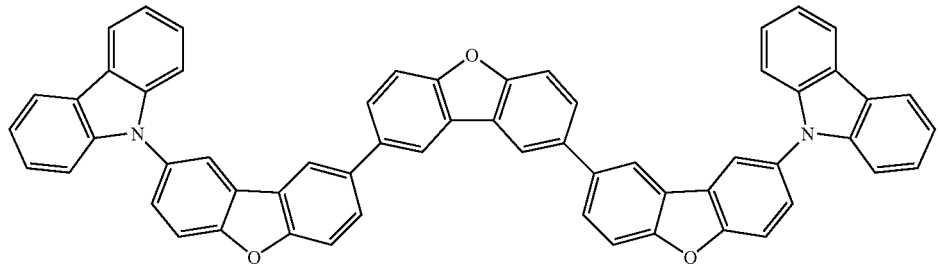

-continued
H-62
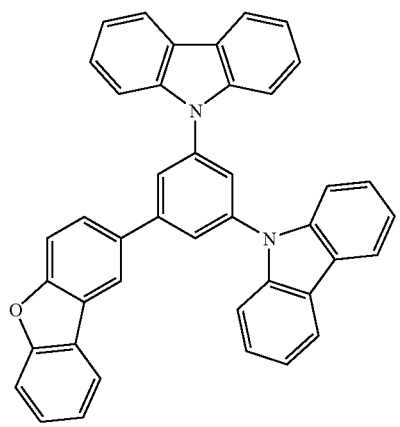
H-63
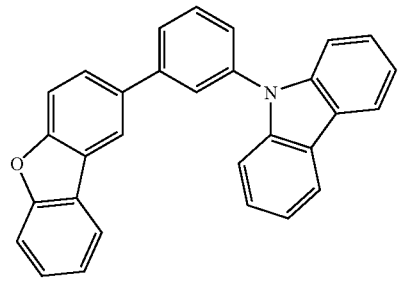
H-64
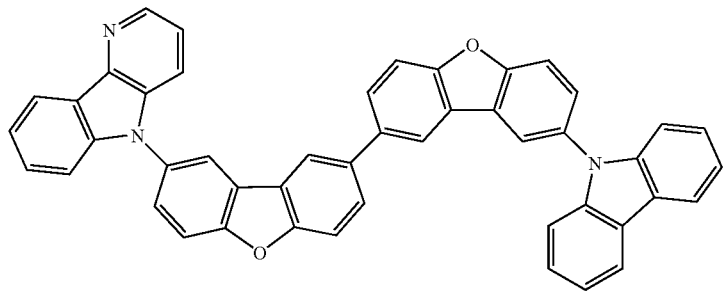
H-65
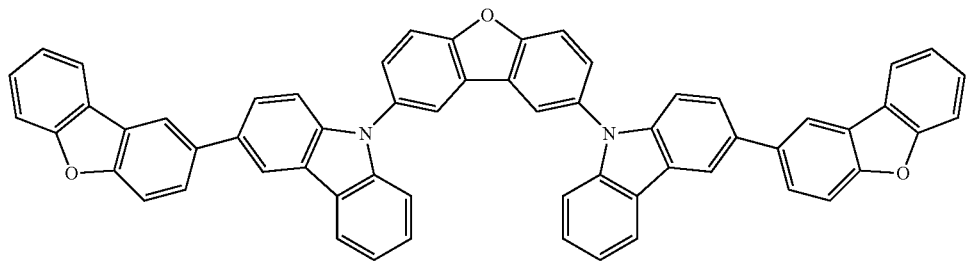
H-66
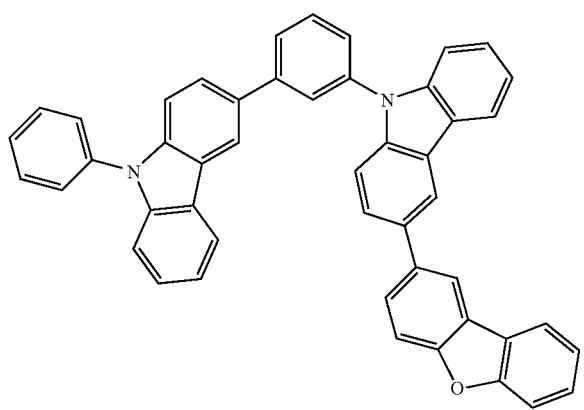
H-67
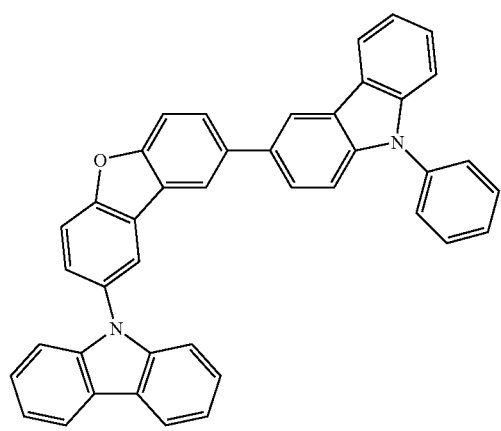

-continued
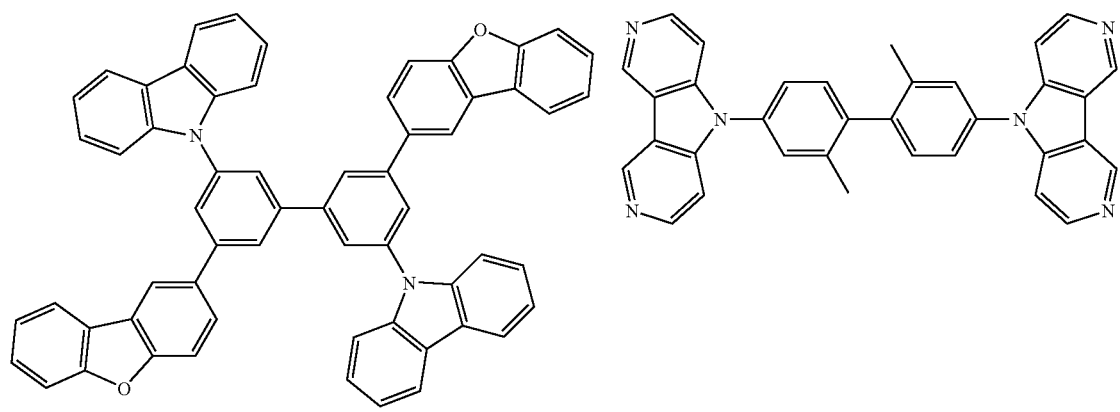
H-68
H-69
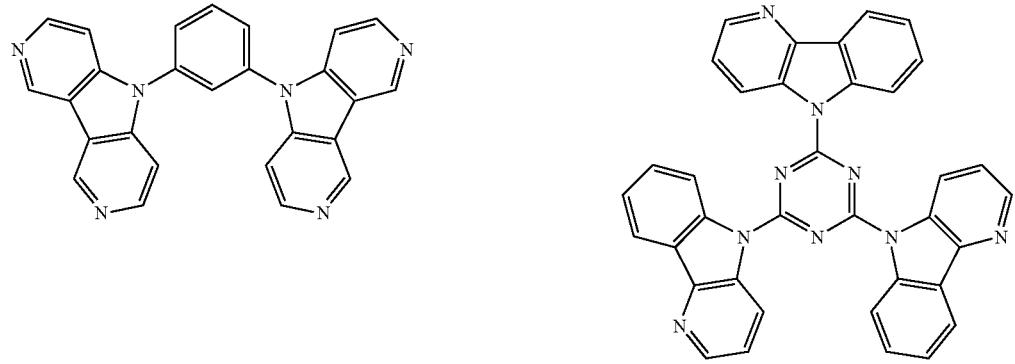
H-70
H-71
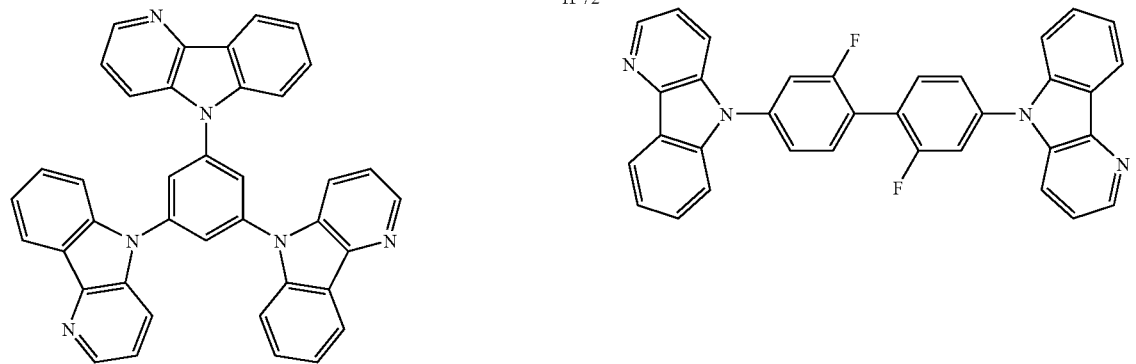
H-72
H-73
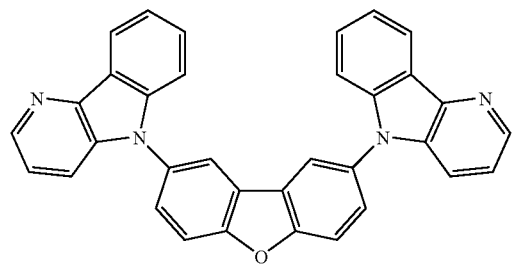
H-74

-continued
H-75
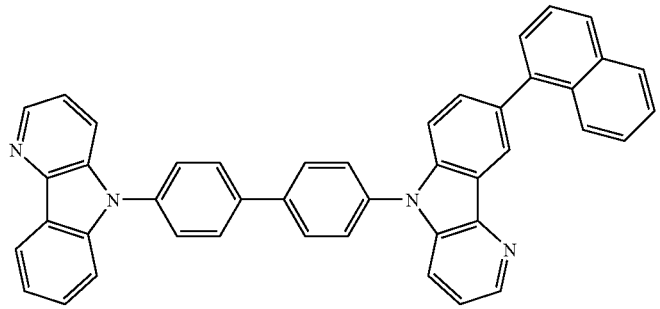
H-76
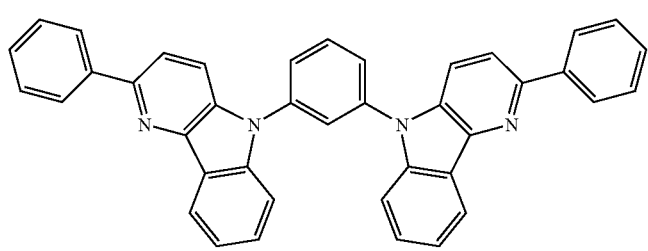
H-77
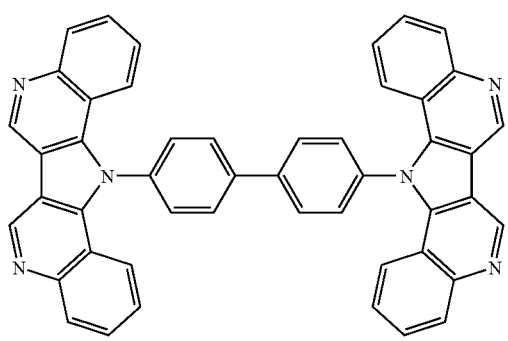
H-78
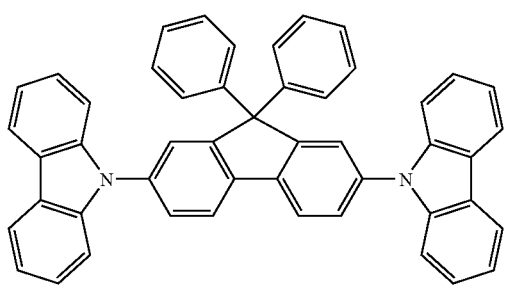
H-79
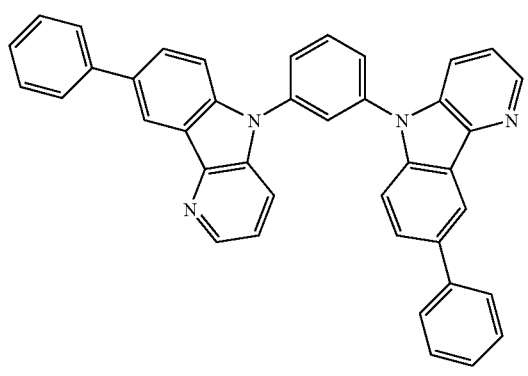
H-80
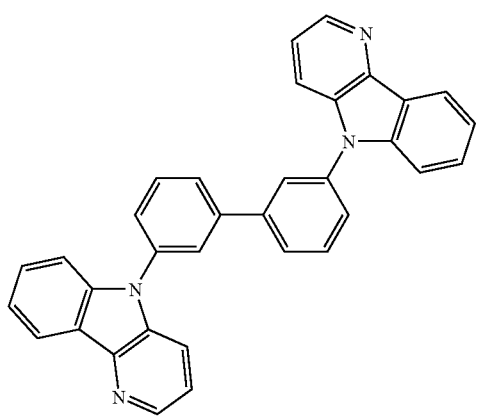

H-81

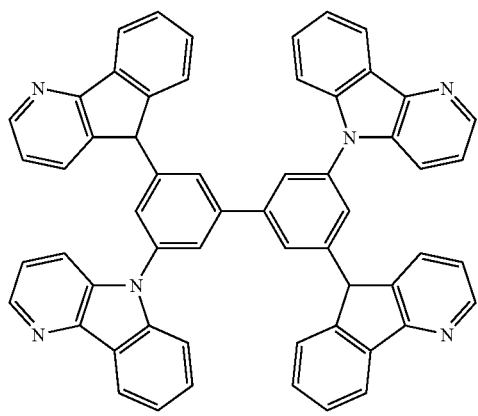

Further, an emission host of this invention may be either a low molecular weight compound or a polymer compound having a repeating unit, in addition to a low molecular weight compound provided with a polymerizing group such as a vinyl group and an epoxy group (an evaporation polymerizing emission host).

An emission host is preferably a compound having a positive hole transporting ability and an electron transporting ability, as well as preventing elongation of an emission wavelength and having a high Tg (a glass transition temperature).

An emission host compound of the present invention may be used with plural known host compounds. It is possible to control the transfer of charges by making use of a plurality of host compounds, which results in high efficiency of an organic EL element. In addition, it is possible to mix a different emission lights by making use of a plurality of phosphorescent compounds. Any required emission color can be obtained thereby. By controlling the kinds of phosphorescent compounds and an amount of dope compounds, white light emission may be achieved and application to a lighting device or a back light may be realized.

As specific examples of an emission host compounds described in the following Documents are preferable: For example, JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084 and 2002-308837.

<<Emission Dopant>>

The emission dopant of the present invention will now be described.

As the emission dopant of the present invention, a phosphorescence-emitting material described below or a fluorescence-emitting compound to be described later can be used. However, of the emission layers of the present invention, one of at least two types of emission dopants contained in the emission layer A is a phosphorescence-emitting material.

<<Phosphorescence-Emitting Material (Phosphorescence-Emitting Compound, or also Referred to as Phosphorescent Compound)>>

The phosphorescent compound of the present invention is a compound, wherein emission from an excited triplet state thereof is observed, emitting phosphorescence at room temperature (25° C.) and exhibiting a phosphorescence quantum yield of at least 0.01 at 25° C. The phosphorescence quantum yield is preferably at least 0.1.

The phosphorescence quantum yield can be determined via a method described in page 398 of Bunko II of Dai 4 Han Jikken Kagaku Koza 7 (Spectroscopy II of 4th Edition Lecture of Experimental Chemistry 7) (1992, published by Maruzen Co., Ltd.). The phosphorescence quantum yield in a solution can be determined using appropriate solvents. However, it is only necessary for the phosphorescent compound of the present invention to exhibit the above phosphorescence quantum yield using any of the appropriate solvents.

Two kinds of principles regarding emission of a phosphorescence-emitting compound are cited. One is an energy transfer-type, wherein carriers recombine on a host compound on which the carriers are transferred to produce an excited state of the host compound, and then via transfer of this energy to a phosphorescent compound, emission from the phosphorescent compound is realized. The other is a carrier trap-type, wherein a phosphorescent compound serves as a carrier trap and then carriers recombine on the phosphorescent compound to generate emission from the phosphorescent compound. In each case, the excited state energy of the phosphorescent compound is required to be lower than that of the host compound.

As the phosphorescence-emitting compound, there may be employed any appropriate compound selected from those known in the art used in an emission layer incorporating an organic EL element. However, the phosphorescence-emitting compound of the present invention is preferably a complex compound containing, as the central metal, a metal (also including a metal ion) of the 8th-10th groups of the periodic table of the elements, but is more preferably an iridium compound, an osmium compound, a platinum compound (a platinum complex compound), or a rare earth complex. Of these, an iridium compound is most preferable.

Examples of the phosphorescence-emitting compound of the present invention are listed below that by no means limit the scope of the present invention. The listed compounds can be synthesized via a method described, for example, in Inorg. Chem., Vol. 40, pages 1704-1711. Incidentally, any appropriate compounds selected from the exemplified ones may be employed as a blue light-emitting dopant, green light-emitting dopant, and red light-emitting dopant.

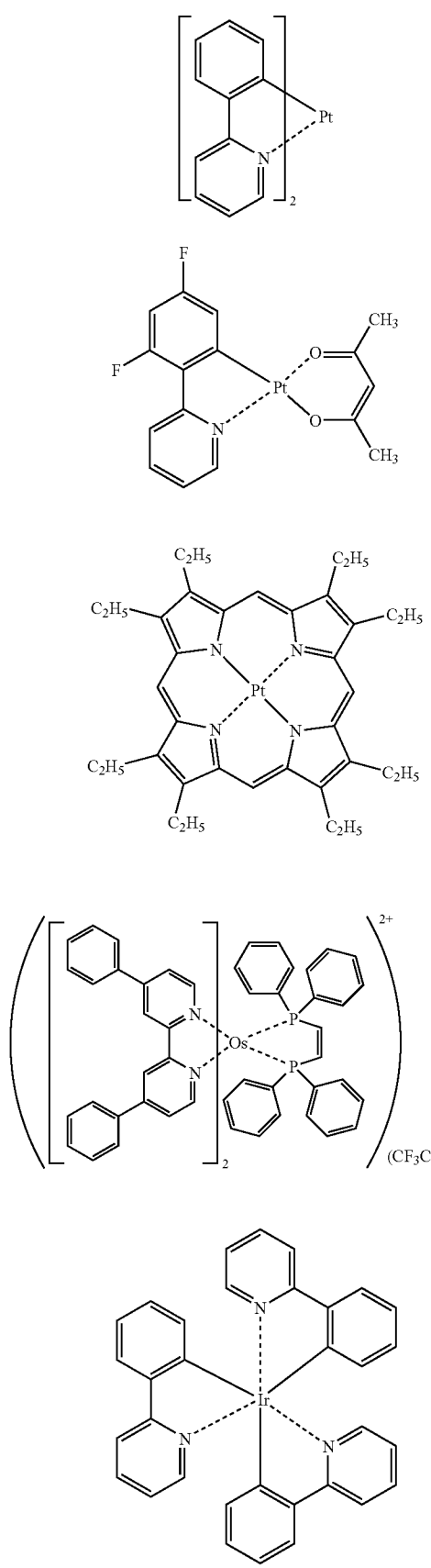
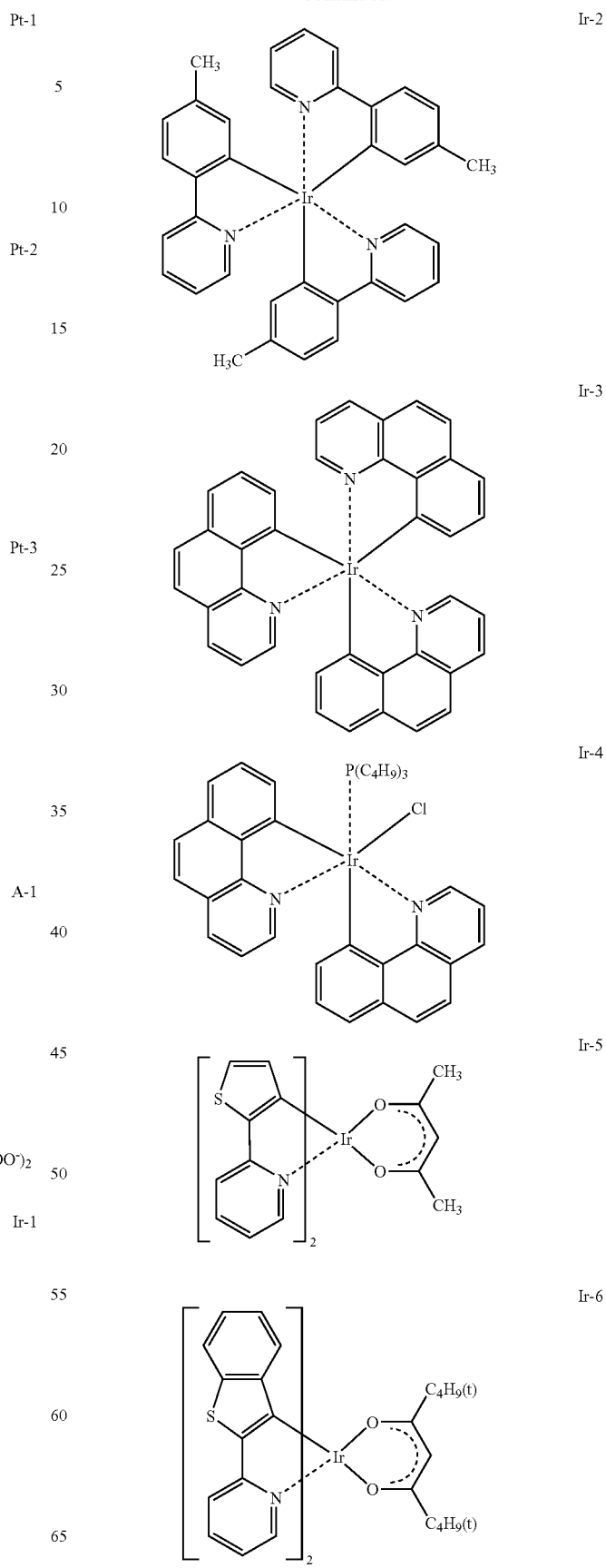

-continued

Ir-7
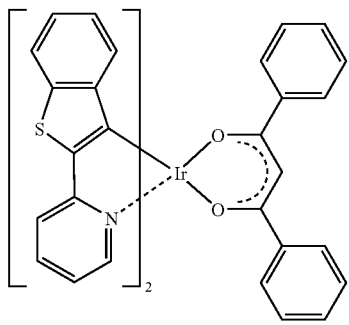

Ir-8
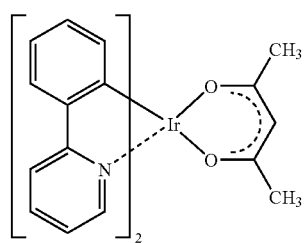

Ir-9
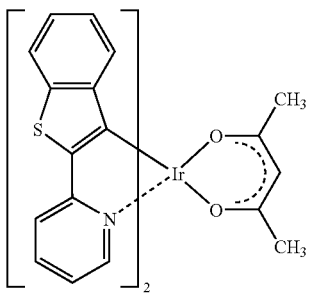

Ir-10
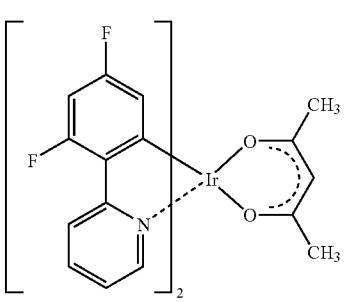

Ir-11
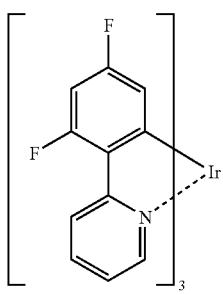

-continued

Ir-12
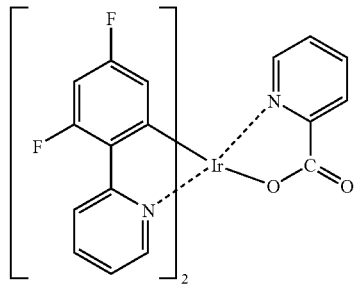

Ir-13
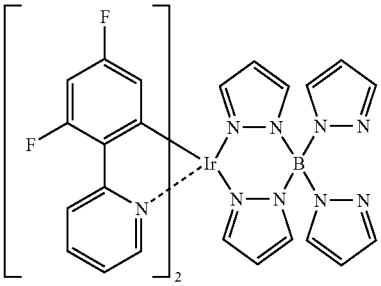

Ir-14
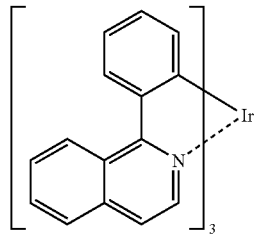

Ir-15
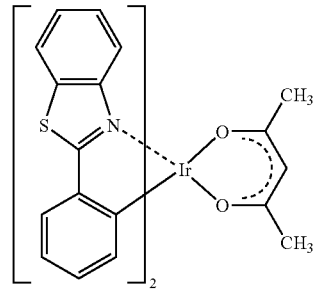

Each of the above organic metal complexes may be used either individually or in combination. Herein, these compounds can be synthesized by referring to a method described, for example, in Inorg. Chem., Vol. 40, pages 1704-1711.

Further, with regard to the phosphorescence-emitting compound of the present invention, a compound (namely a blue light-emitting dopant) having a partial structure represented by above Formula (1), following Formula (2), or following Formula (3) is preferable for a so-called blue emission dopant which emits blue light from an excited triplet state thereof, but a compound having a partial structure represented by Formula (2) or Formula (3) is more preferable, and further a compound having a partial structure represented by Formula (3) is specifically preferable.

<<Compounds Having a Partial Structure Represented by Formula (1) (Blue Emission Dopants)>>

In Formula (1), a 5-membered aromatic heterocycle formed with Z1 includes an oxazole ring, an imidazole ring, a pyrazole ring, and a triazole ring. These rings may have a substituent to be described later.

In Formula (1), a 5-membered or 6-membered aromatic heterocycle formed with Z2 includes an oxazole ring, thiophene ring, furan ring, pyrrole ring, pyridine ring, pyridazine ring, pyrimidine ring, pyrazine ring, triazine ring, imidazole ring, pyrazole ring, triazole ring, thiazole ring, isoxazole ring, isothiazole ring, and tetrazole ring. These rings may have a substituent to be described later.

In Formula (1), a 6-membered aromatic hydrocarbon ring formed with Z2 includes a benzene ring. The benzene ring may have a substituent to be described later.

<<Compounds Having a Partial Structure Represented by Formula (2)>>

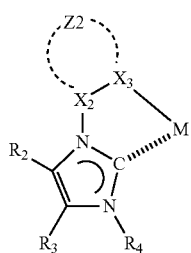

Formula (2)

wherein $X_2$ and $X_3$ each represent a carbon atom or a nitrogen atom; $R_2$, $R_3$, and $R_4$ each represent a hydrogen atom or a substituent; Z2 represents a 5-membered or 6-membered aromatic heterocycle or a 6-membered aromatic hydrocarbon ring; and M represents Ir or Pt.

The substituents each represented by $R_2$, $R_3$, and $R_4$ in Formula (2) are identical with substituents, to be described later, which may be contained in the 5-membered aromatic heterocycle formed with Z1, the 5-membered or 6-membered aromatic heterocycle formed with Z2, or the 6-membered aromatic hydrocarbon ring formed with Z2 in Formula (1), Formula (2), or Formula (3).

The 5-membered aromatic heterocycle formed with Z2 in Formula (2) is identical with the 5-membered aromatic heterocycle formed with Z1 in Formula (1).

The 5-membered or 6-membered aromatic heterocycle formed with Z2 in Formula (2) is identical with the 5-membered or 6-membered aromatic heterocycle formed with Z2 in Formula (1).

The 6-membered aromatic hydrocarbon ring formed with Z2 in Formula (2) is identical with the aromatic hydrocarbon ring formed with Z2 in Formula (1).

<<Compounds Having a Partial Structure Represented by Formula (3)>>

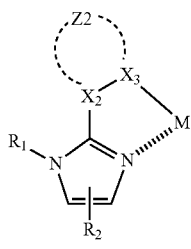

Formula (3)

wherein $X_2$ and $X_3$ each represent a carbon atom or a nitrogen atom; $R_1$ and $R_2$ each represent a hydrogen atom or a substituent; Z2 represents a 5-membered or 6-membered aromatic heterocycle or a 6-membered aromatic hydrocarbon ring; and M represents Ir or Pt.

The substituents each represented by $R_1$ and $R_2$ in Formula (3) are identical with substituents, to be described later, which may be contained in the 5-membered aromatic heterocycle formed with Z1, the 5-membered or 6-membered aromatic heterocycle formed with Z2, or the 6-membered aromatic hydrocarbon ring formed with Z2 in Formula (1), Formula (2), or Formula (3).

The 5-membered aromatic heterocycle formed with Z2 in Formula (3) is identical with the 5-membered aromatic heterocycle formed with Z1 in Formula (1).

The 5-membered or 6-membered aromatic heterocycle formed with Z2 in Formula (3) is identical with the 5-membered or 6-membered aromatic heterocycle formed with Z2 in Formula (1).

The 6-membered aromatic hydrocarbon ring formed with Z2 in Formula (3) is identical with the aromatic hydrocarbon ring formed with Z2 in Formula (1).

(Substituents)

In Formula (1), Formula (2), or Formula (3), the 5-membered aromatic heterocycle formed with Z1, the 5-membered or 6-membered aromatic heterocycle formed with Z2, and the 6-membered aromatic hydrocarbon ring formed with Z2 each may further have a substituent, including, for example, an alkyl group (for example, a methyl group, an ethyl group, a propyl group, an isopropyl group, and a tert-butyl group, a pentyl group, a hexyl group, an octyl group, a dodecyl group, a tridecyl group, a tetradecyl group, and a pentadecyl group), a cycloalkyl group (for example, a cyclopentyl group and a cyclohexyl group), an alkenyl group (for example, a vinyl group and an allyl group), an alkynyl group (for example, a propargyl group), an aryl group (for example, a phenyl group, a tolyl group, a xylyl group, a naphthyl group, a biphenylyl group, an anthryl group, and a phenanthryl group), a heterocyclic group (for example, a pyridyl group, a thiazolyl group, an oxazolyl group, an imidazolyl group, a furyl group, a pyrrolyl group, a pyrazinyl group, a pyrimidinyl group, a pyridazinyl group, a selenazolyl group, a sulfolanyl group, a piperidinyl group, a pyrazolyl group, and a tetrazolyl group), an alkoxy group (for example, a methoxy group, an ethoxy group, a propyloxy group, a pentyloxy group, a hexyloxy group, an octyloxy group, and a dodecyloxy group), a cycloalkoxy group (for example, a cyclopentyloxy group and a cyclohexyloxy group), an aryloxy group (for example, a phenoxy group and a naphthyloxy group), an alkylthio group (for example, a methylthio group, an ethylthio group, a propylthio group, a pentylthio group, a hexylthio group, an octylthio group, and a dodecylthio group), a cycloalkylthio group (for example, a cyclopentylthio group and a cyclohexylthio group), an arylthio group (for example, a phenylthio group and a naphthylthio group), an alkoxylcarbonyl group (for example, a methyloxycarbonyl group, an ethyloxycarbonyl group, a butyloxycarbonyl group, an octyloxycarbonyl group, and a dodecyloxycarbonyl group), an aryloxycarbonyl group (for example, a phenyloxycarbonyl group and a naphthyloxycarbonyl group), a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylaminosulfonyl group, and a 2-pyridylaminosulfonyl group), a ureido group (for example, a methylureido group, an ethylureido group, a pentylureido group, a cyclohexylureido group, an octylureido group, a dodecylureido group, a phenylureido group, a naphthylureido group, and a 2-pyridylaminoureido group), an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenylcarbonyl group, a naphthylcarbonyl group, and a pyridylcarbonyl group), an acyloxy group (for example, an acetyloxy group, an ethylcarbonyloxy group, a butylcarbonyloxy group, an octylcarbonyloxy group, a dodecylcarbonyloxy group, and a phenylcarbonyloxy group), an amide group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group, and a naphthylcarbonylamino group), a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group, and a 2-pyridylaminocarbonyl group), a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group, and a 2-pyridylsulfinyl group), an alkylsulfonyl group or an arylsulfonyl group (for example, a methylsulfonyl group, an ethylsulfonyl, a butylsulfonyl group, a cyclohexylsulfonyl group, a 2-ethylhexylsulfonyl group, a dodecylsulfonyl group, a phenylsulfonyl group, a naphthylsulfonyl group, and a 2-pyridylsulfonyl group), an amino group (for example, an amino group, an ethylamino group, a dimethylamino group, a butylamino group, a cyclopentylamino group, a 2-ethylhexylamino group, a dodecylamino group, an anilino group, a naphthylamino group, and a 2-pyridylamino group), a nitro group, and a cyano group.

Examples of the compound (the metal complex) having a partial structure represented by Formula (1), Formula (2), or Formula (3) are listed below that by no means limit the scope of the present invention.

D-1
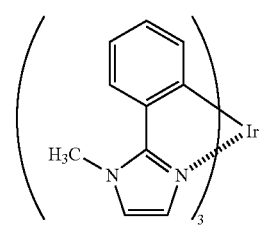

D-2
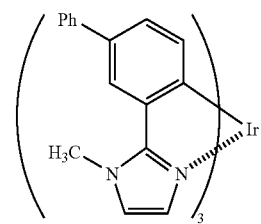

D-3
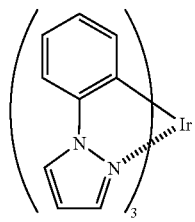

D-4
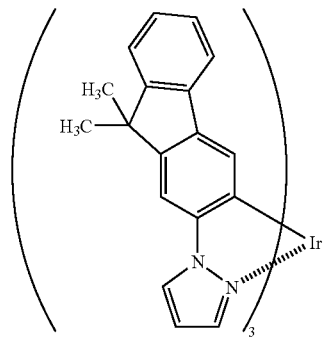

D-5
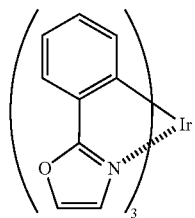

D-6
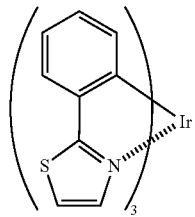

D-7
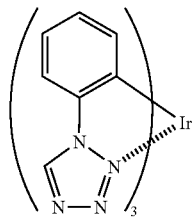

D-8
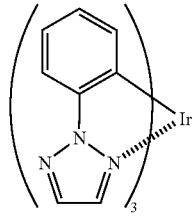

D-9
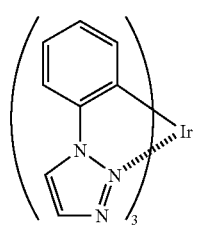
D-10
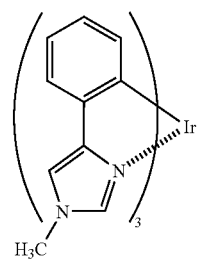
D-11
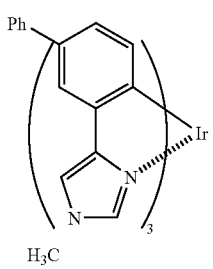
D-12
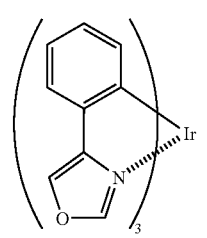
D-13
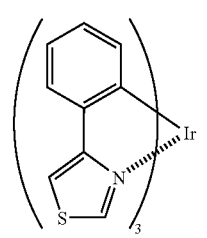
D-14
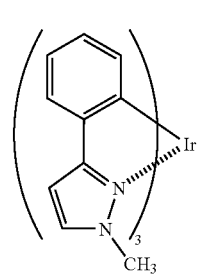
D-15
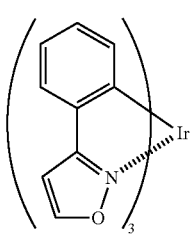
D-16
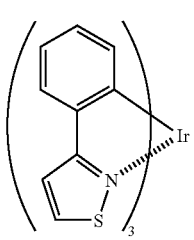
D-17
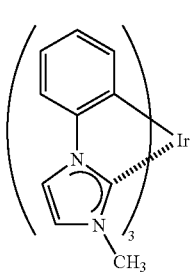
D-18
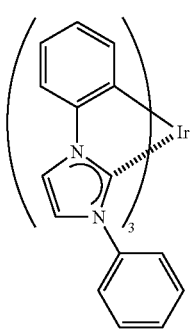
D-19
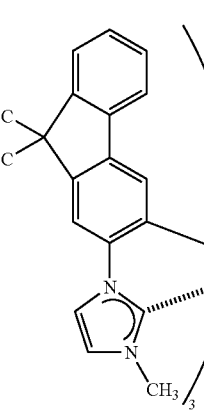

D-20
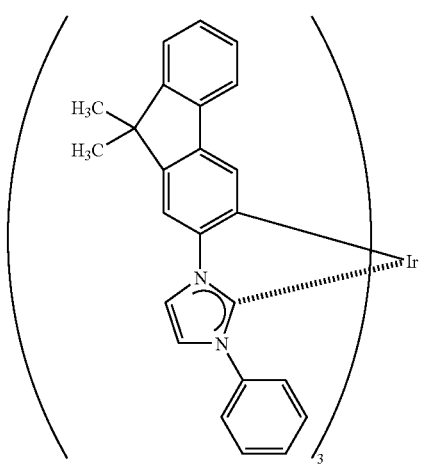
D-21
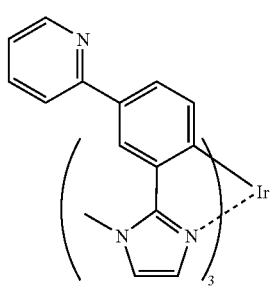
D-22
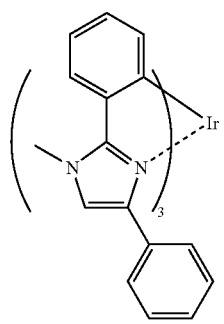
D-23
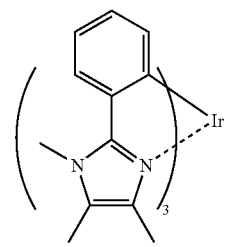
D-24
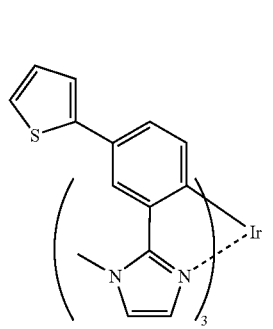
D-25
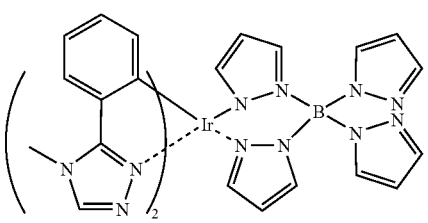
D-26
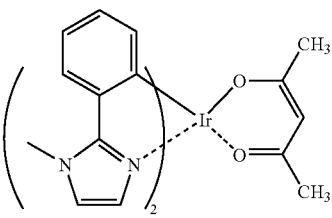
D-27
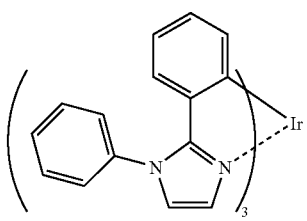
D-28
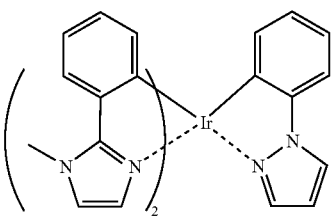
D-29
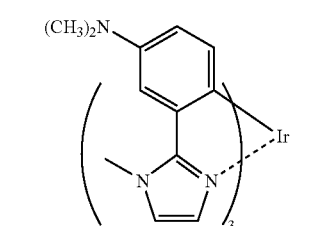
D-30
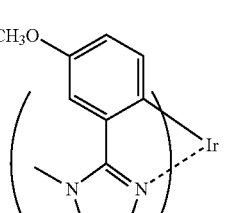
D-31
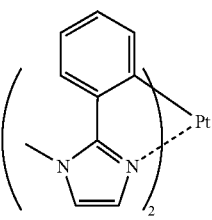

D-32 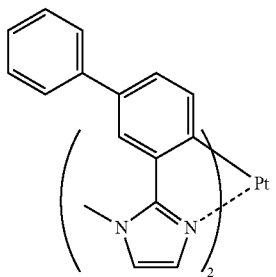
D-33 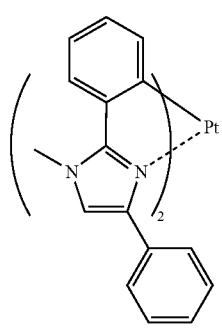
D-34 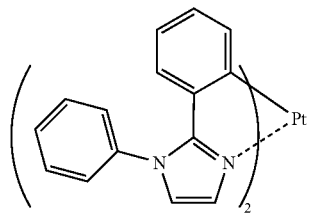
D-35 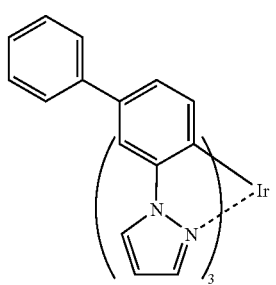
D-36 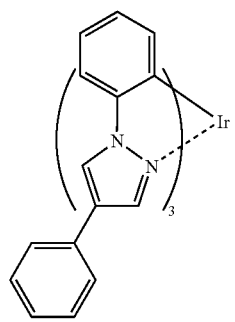
D-37 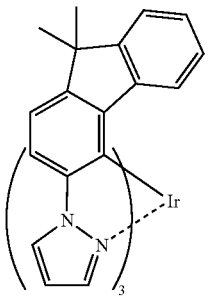
D-38 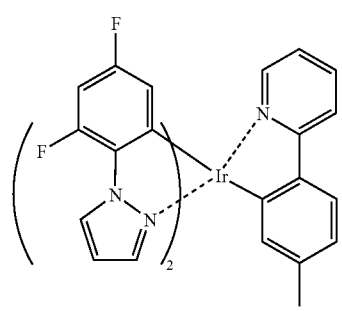
D-39 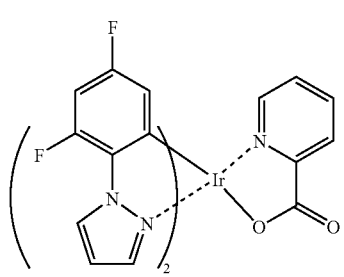
D-40 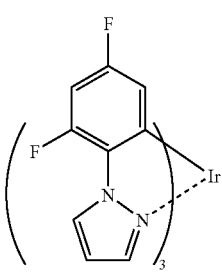
D-41 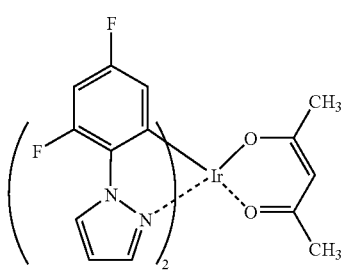

D-42
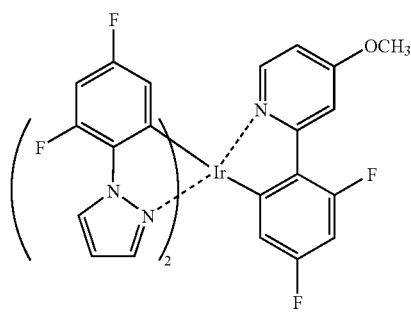
D-43
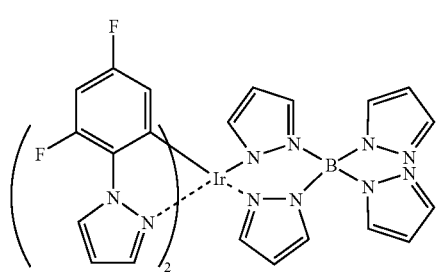
D-44
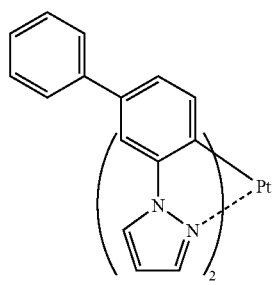
D-45
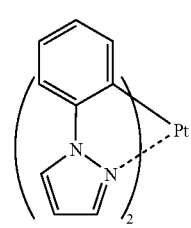
D-46
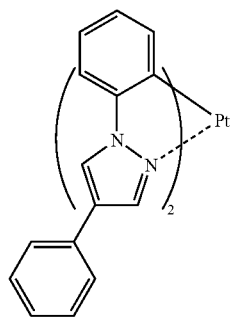
D-47
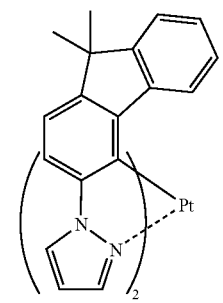
D-48
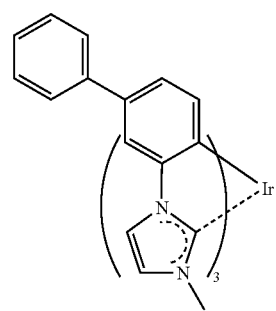
D-49
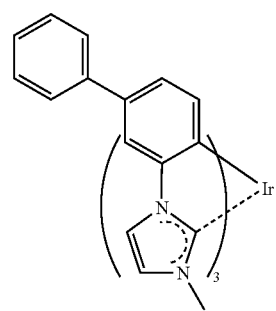
D-50
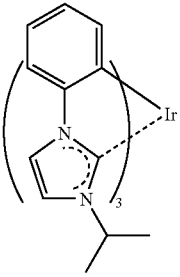
D-51
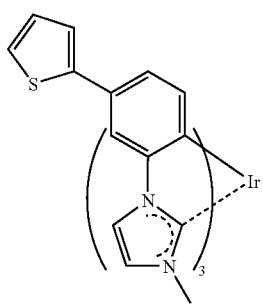

D-52
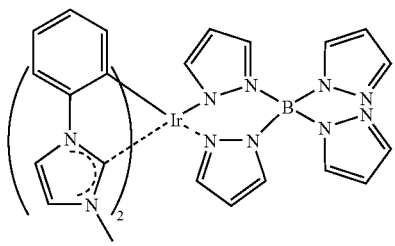
D-53
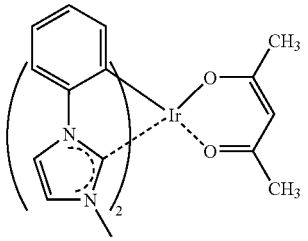
D-54
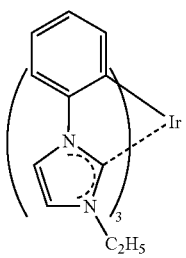
D-55
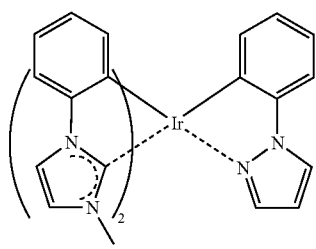
D-56
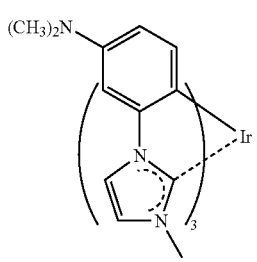
D-57
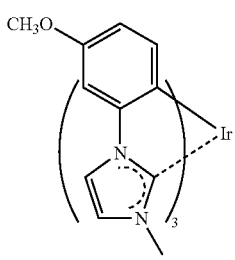
D-58
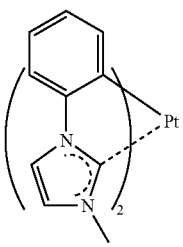
D-59
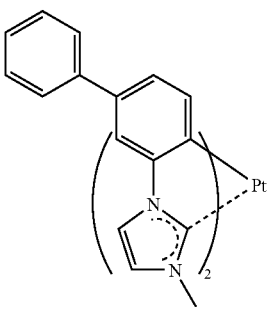
D-60
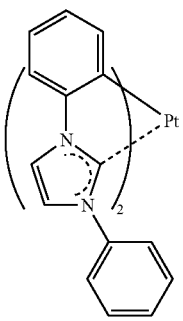
D-61
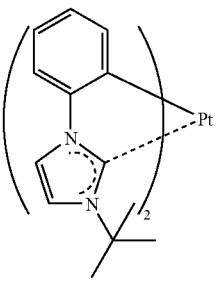
D-62
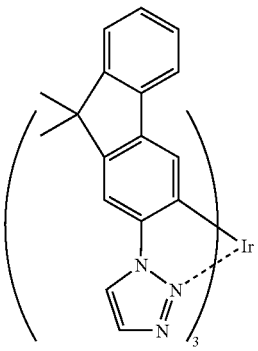

D-63
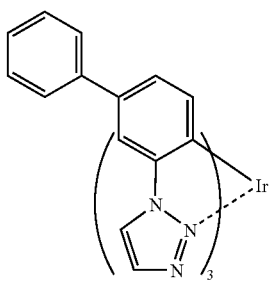
D-64
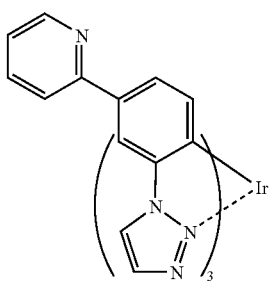
D-65
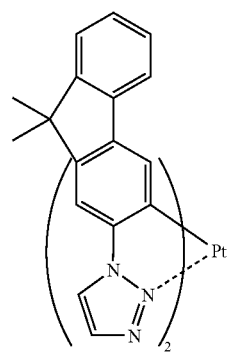
D-66
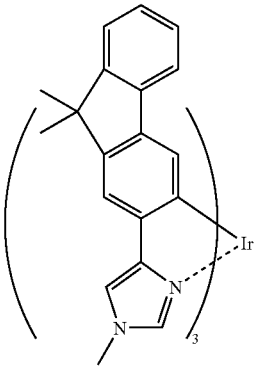
D-67
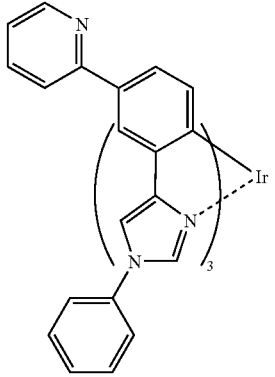
D-68
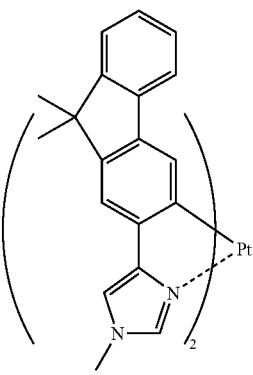
D-69
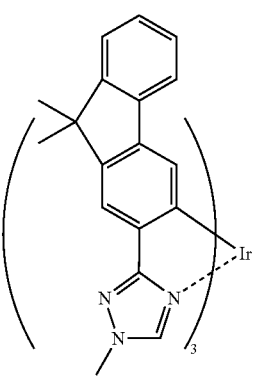
D-70
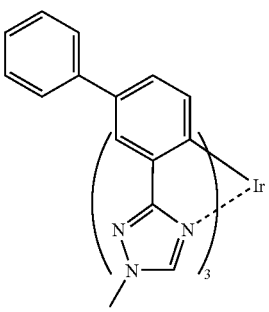
D-71
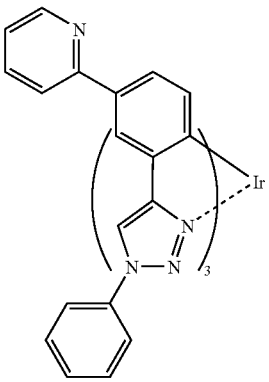

D-72
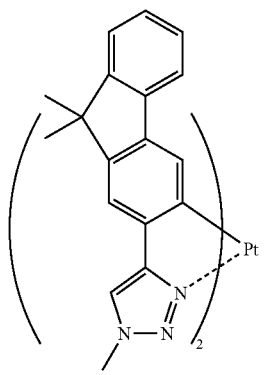
D-73
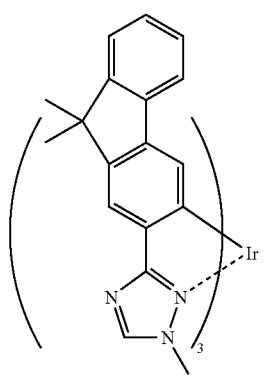
D-74
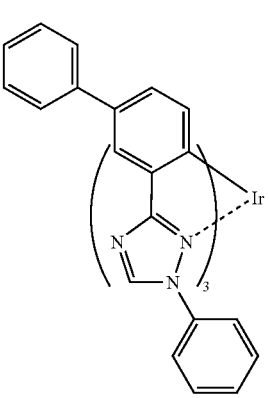
D-75
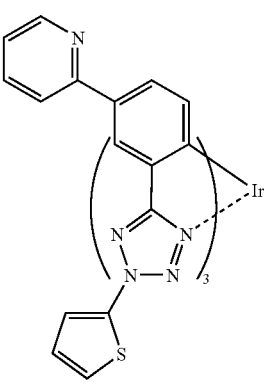
D-76
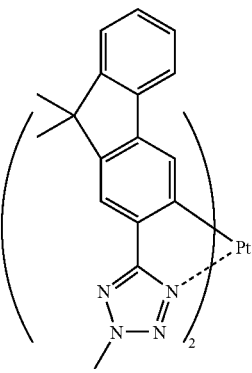
D-77
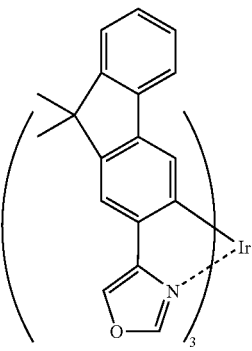
D-78
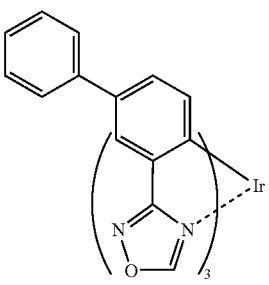
D-79
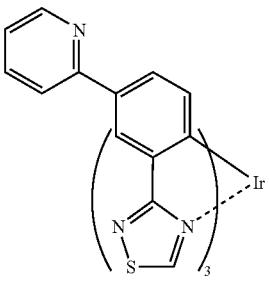
D-80
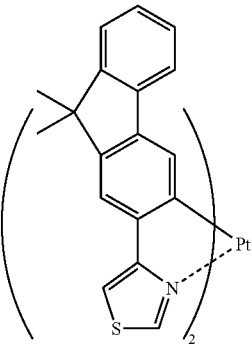

D-81
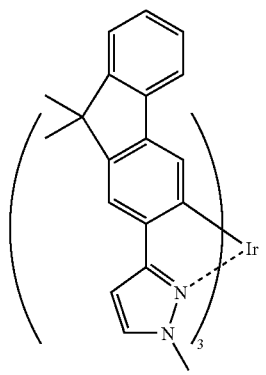
D-82
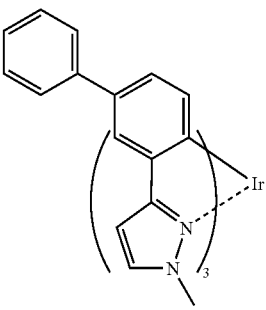
D-83
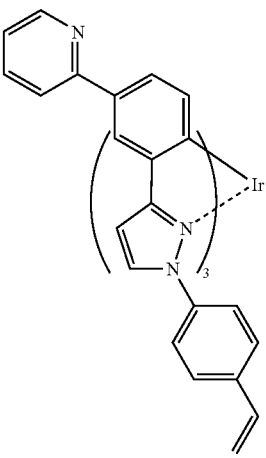
D-84
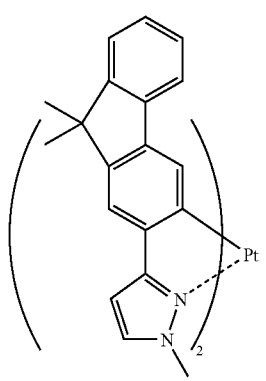
D-85
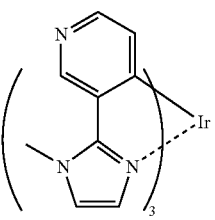
D-86
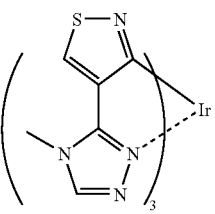
D-87
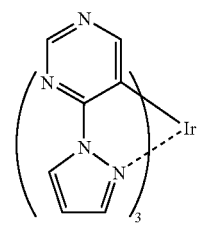
D-88
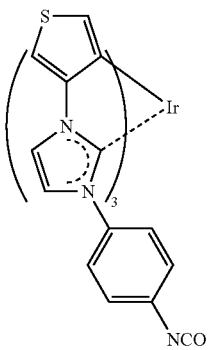
D-89
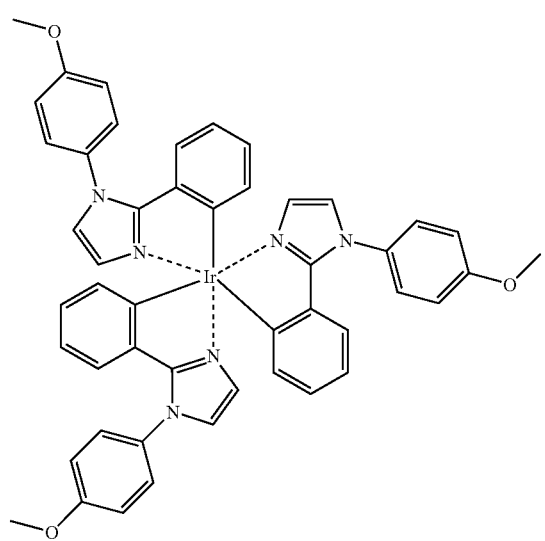

-continued
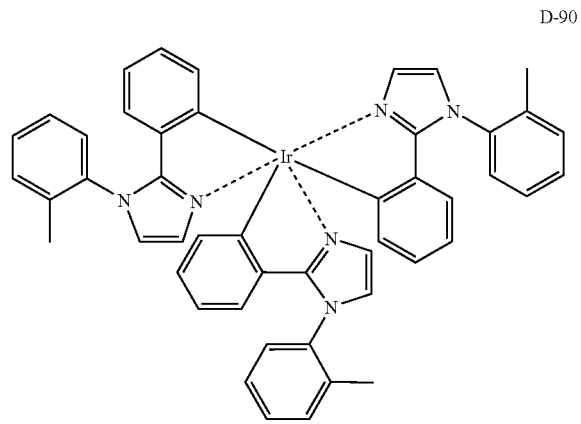
D-90
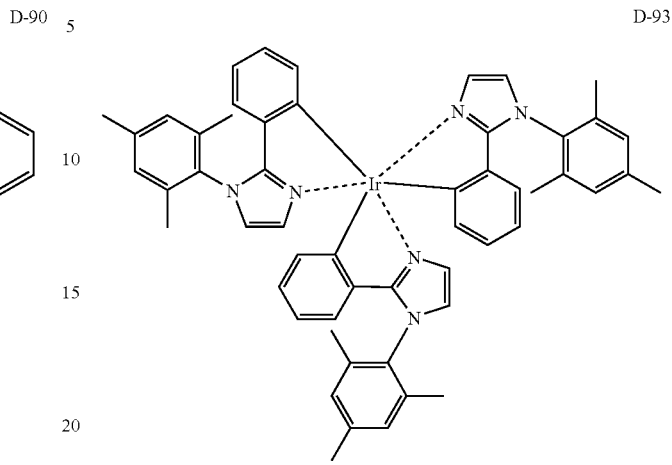
D-93
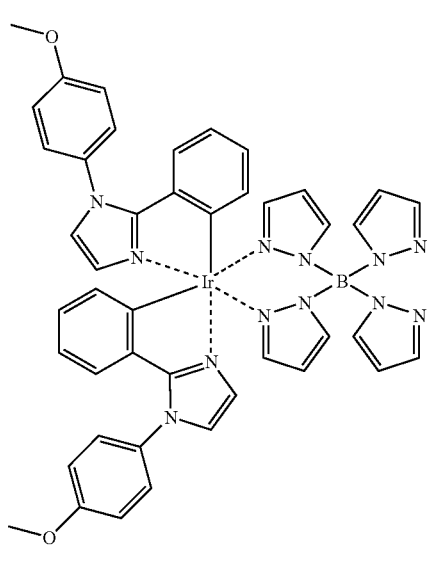
D-91
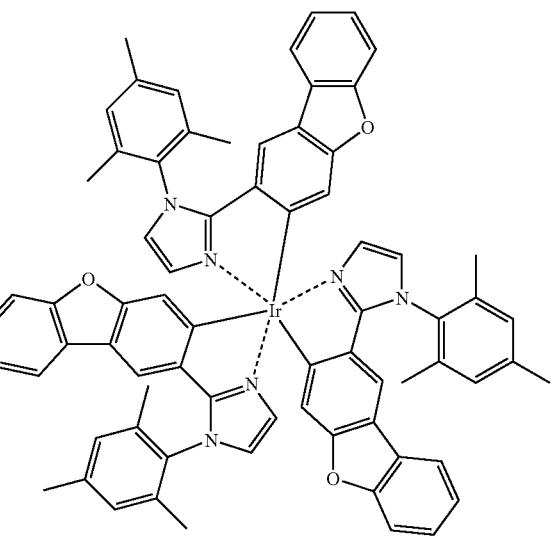
D-94
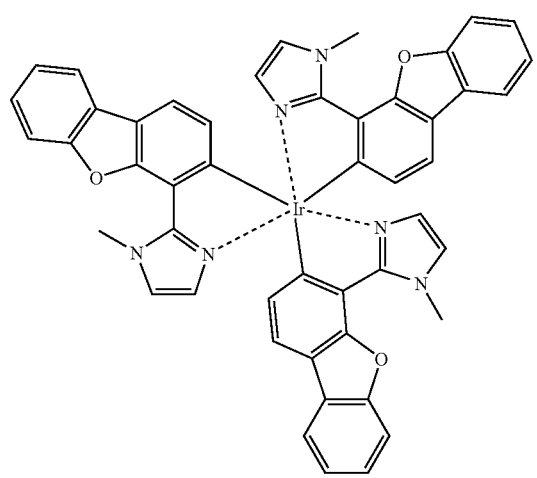
D-92
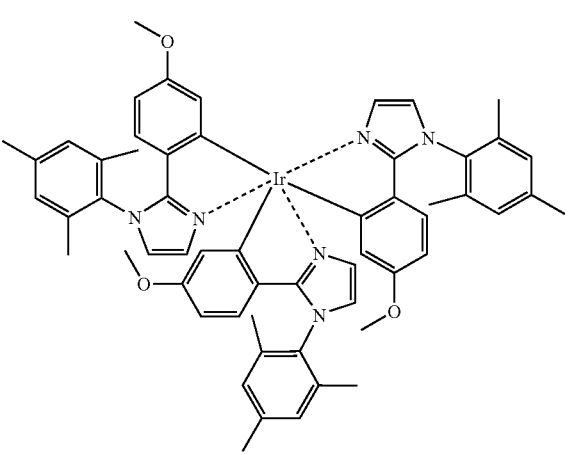
D-95

-continued
D-96
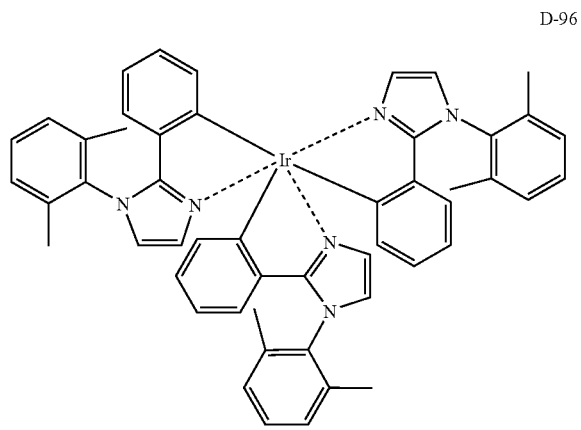
D-97
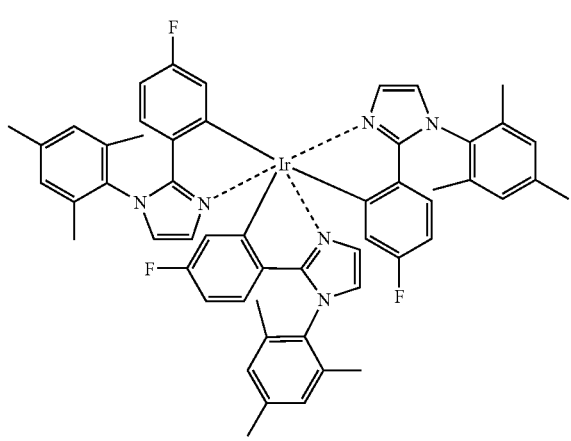
D-98
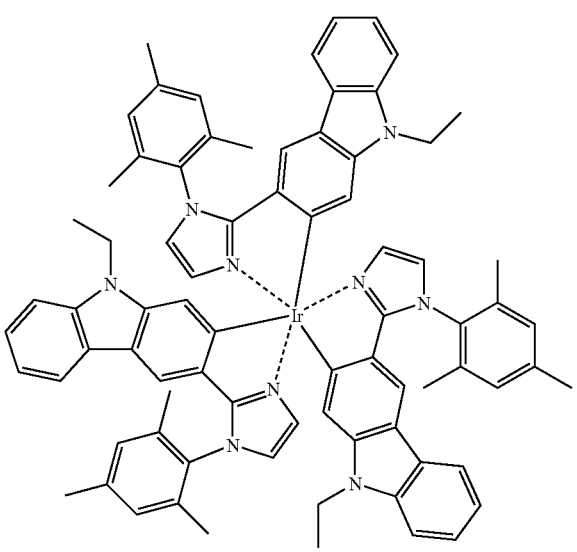
-continued
D-99
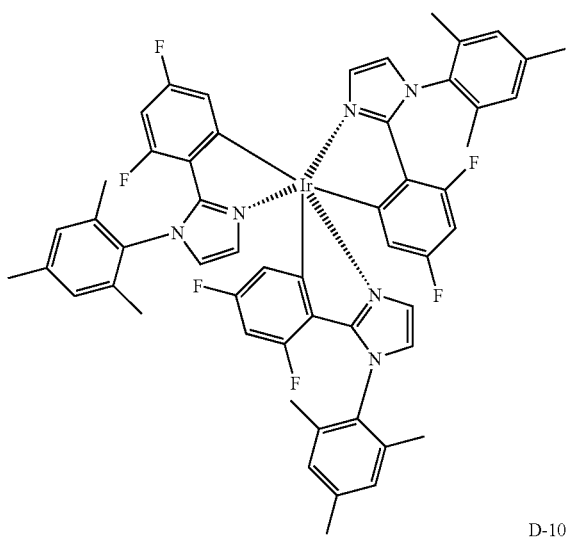
D-100
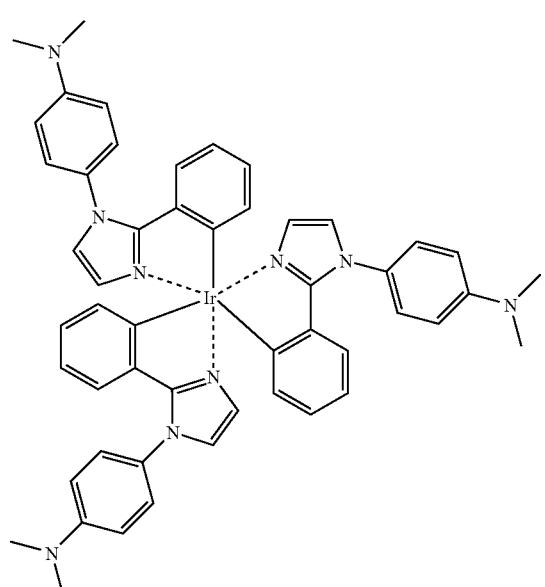
D-101
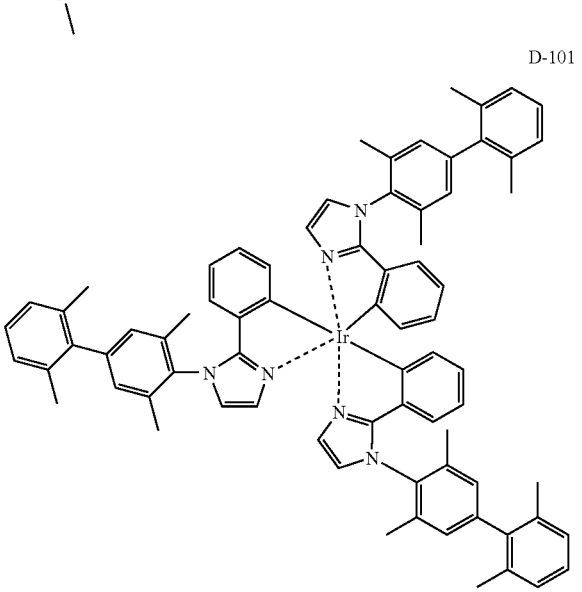

D-102
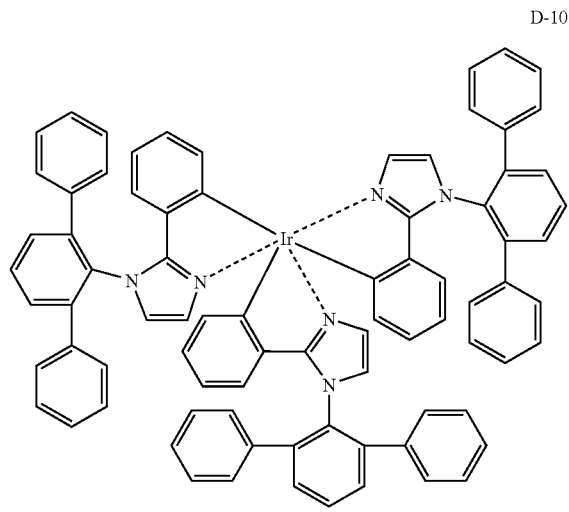
D-105
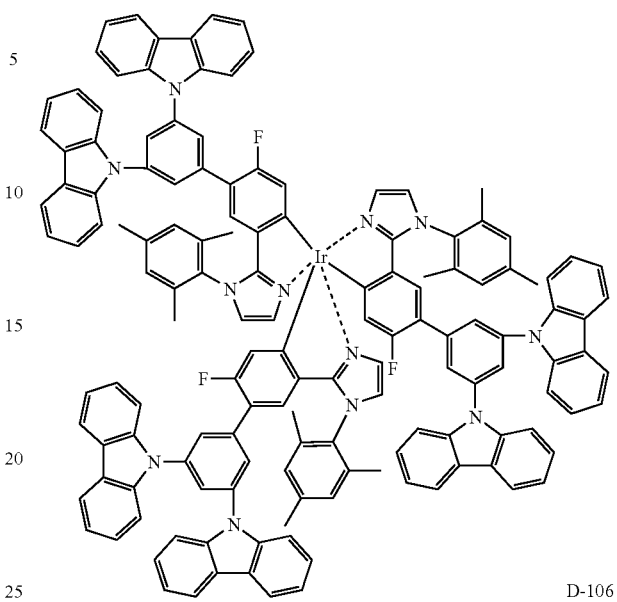
D-103
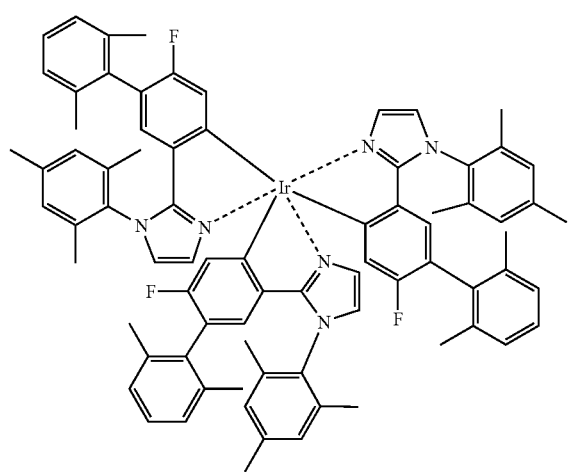
D-106
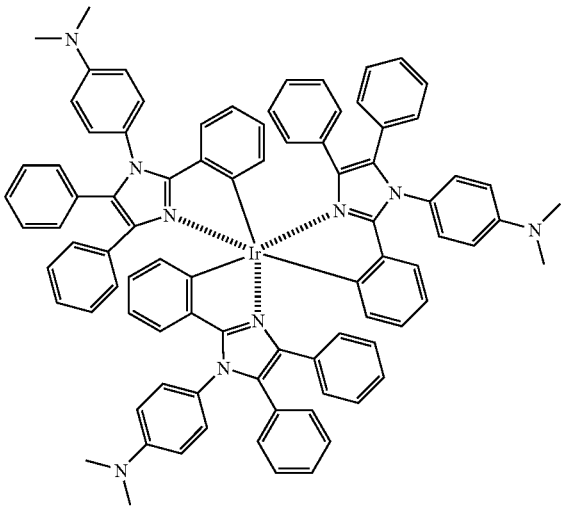
D-104
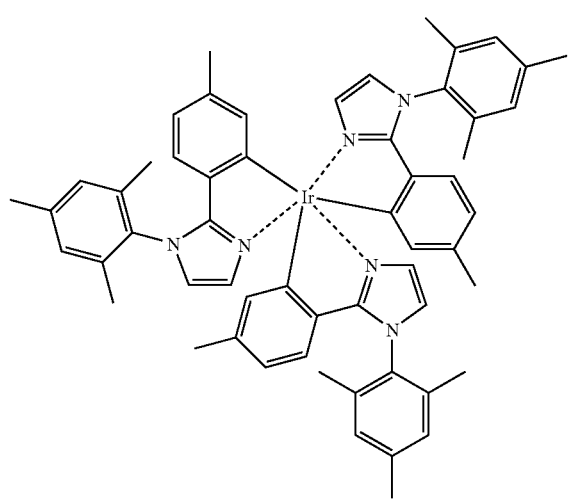
D-107
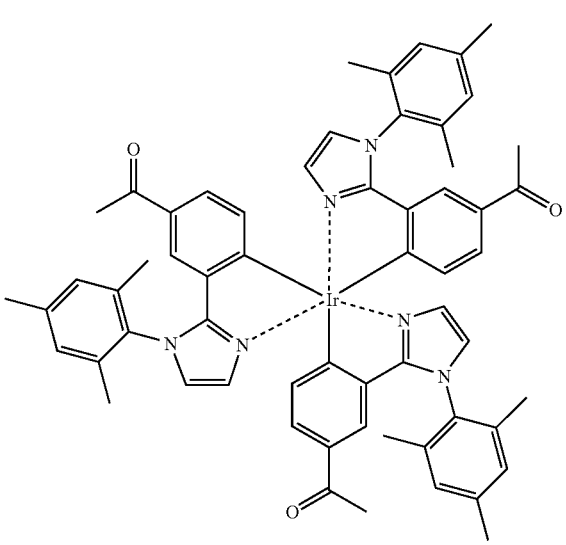

-continued
D-108
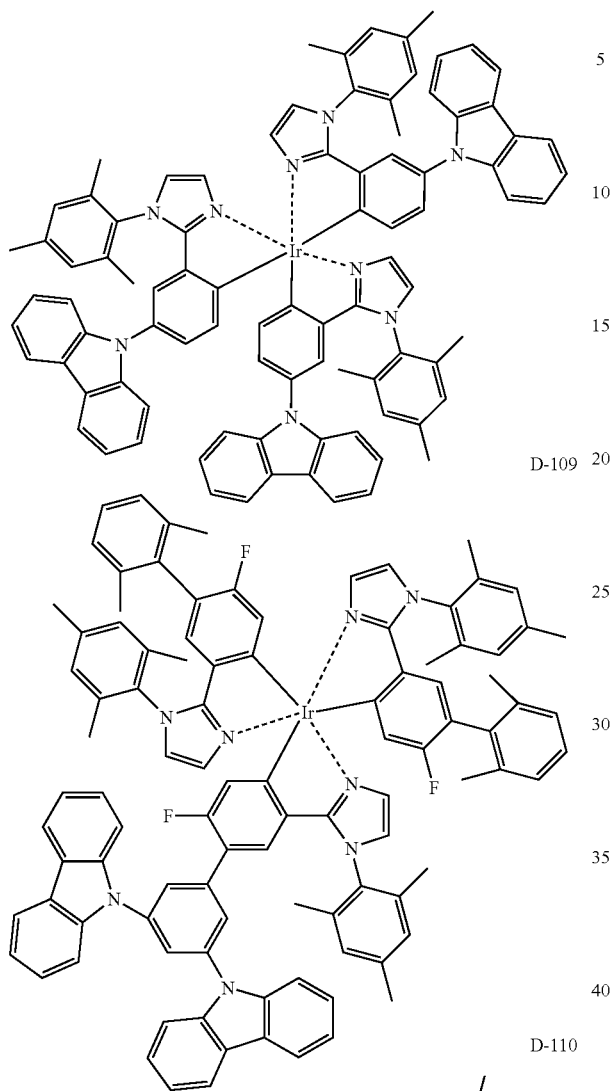
D-109
D-110
D-111
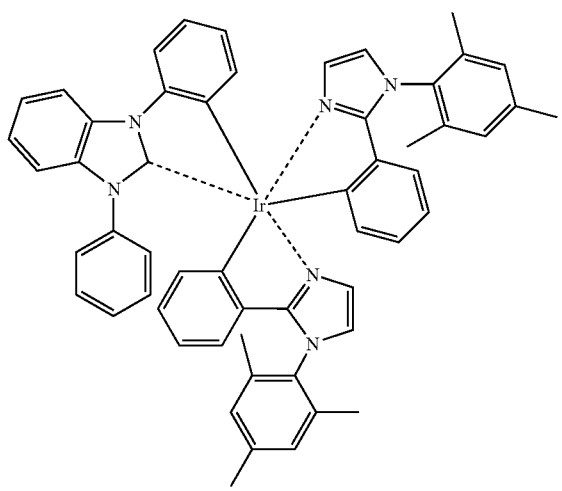
D-112
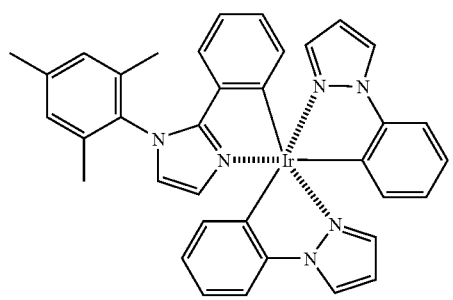
D-113
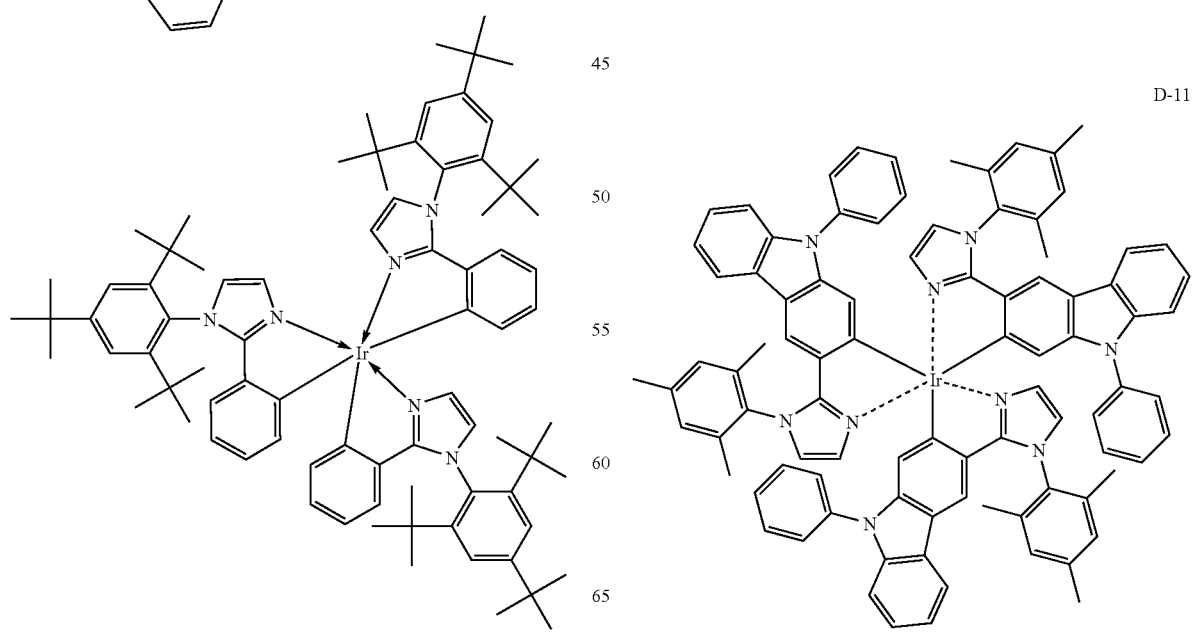

D-114
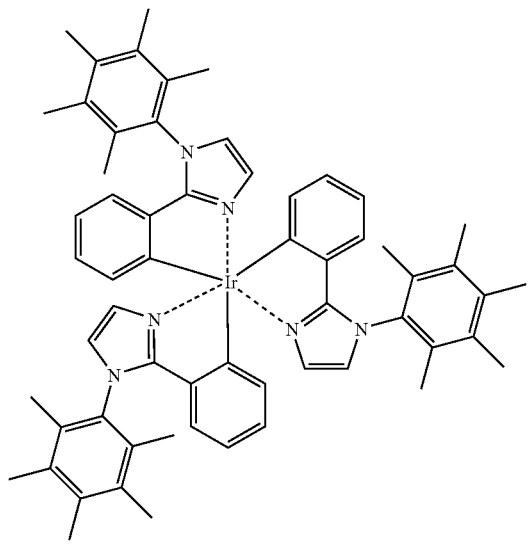
D-117
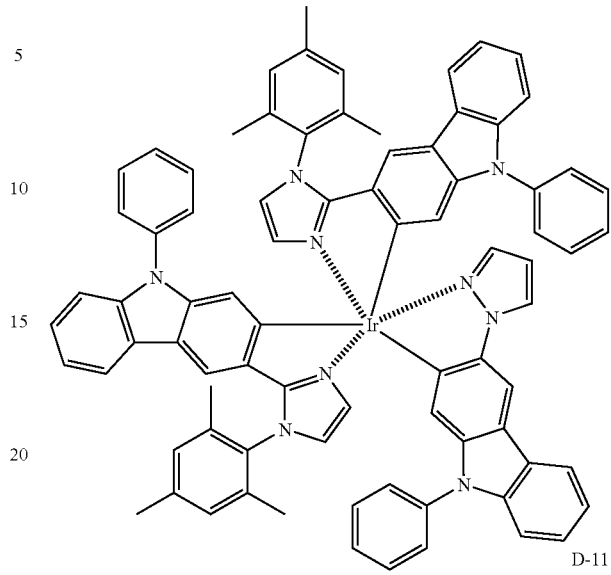
D-115
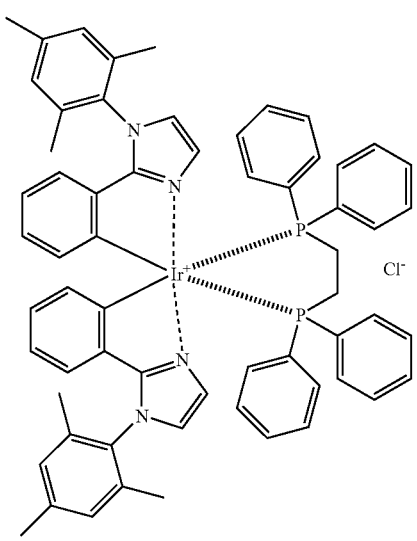
D-118
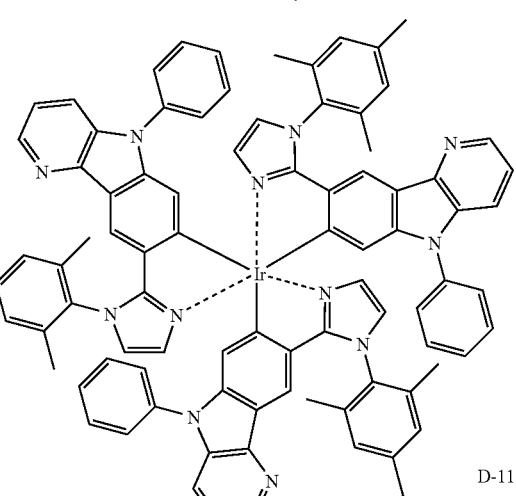
D-116
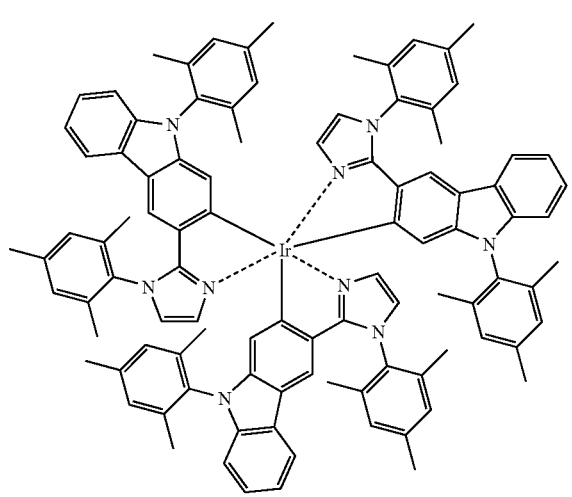
D-119
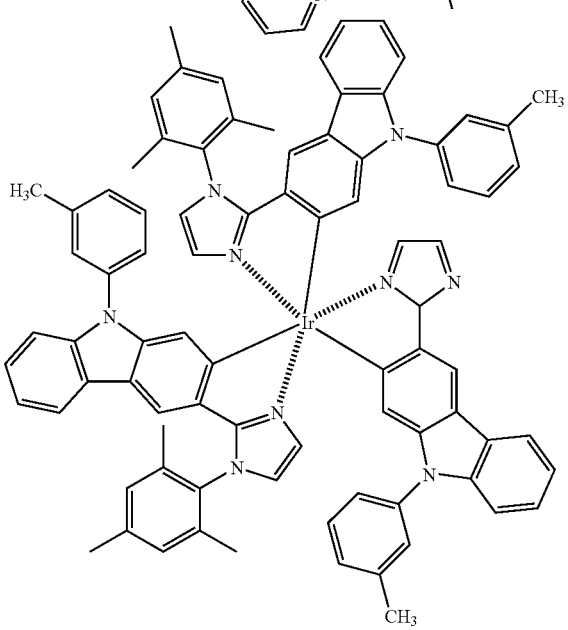

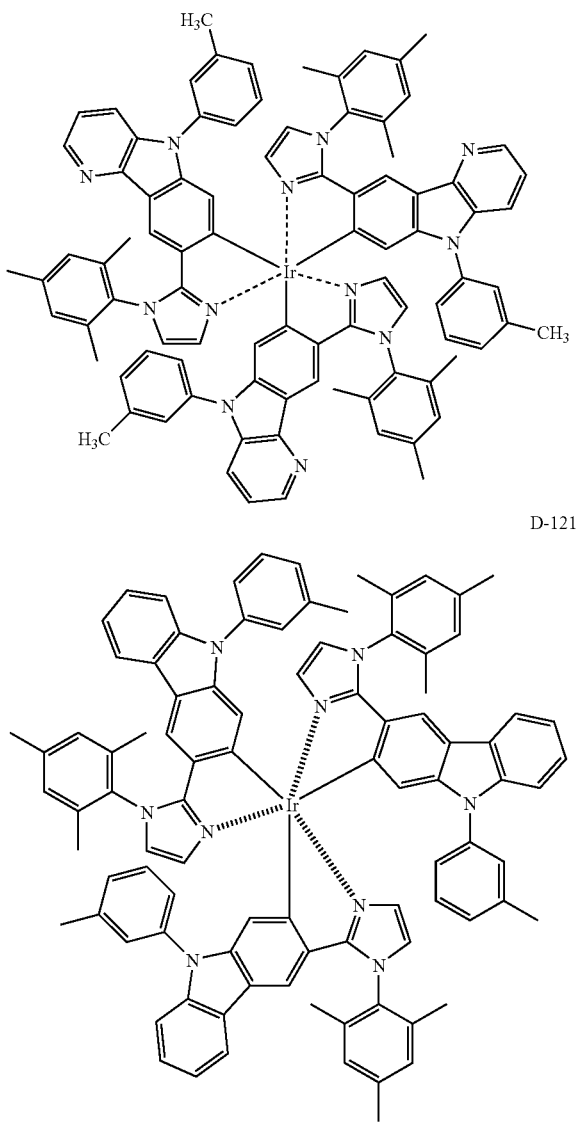

The phosphorescence wavelength of the blue phosphorescence-emitting compound of the present invention represented by Formula (1), Formula (2), or Formula (3) is preferably less than 480 nm.

(The Ionization Potential (Ip) of the Blue Emission Dopant)

The ionization potential (Ip) of the blue emission dopant of the present invention is preferably at most 5.5 eV, more preferably from 4.5 eV-5.5 eV.

Herein, the ionization potential according to the present invention is defined as energy required for releasing electrons at the HOMO (the highest occupied molecular orbital) of a compound to the vacuum level, and is specifically defined as energy required for taking out electrons from a compound in a film form (a layer form). The energy can directly be determined via photoelectron spectroscopy. In the present invention, a value obtained via measurement using ESCA 5600 UPS (ultraviolet photoemission spectroscopy) (produced by Ulvac-Phi, Inc.) is employed.

(Synthetic Methods of the Phosphorescence-Emitting Compound)

The phosphorescence-emitting compound of the present invention can be synthesized by applying methods described, for example, in Organic Letter, Vol. 13, No. 16, pages 2579-2581 (2001), Inorganic Chemistry, Vol. 30, No. 8, pages 1685-1687 (1991), J. Am. Chem. Soc., Vol. 123, page 4304 (2001), Inorganic Chemistry, Vol. 40, No. 7, pages 1704-1711 (2001), Inorganic Chemistry, Vol. 41, No. 12, pages 3055-3066 (2002), and New Journal of Chemistry, Vol. 26, page 1171 (2002), as well as by applying methods described in references cited therein.

<<Phosphorescence Wavelength>>

The phosphorescence wavelength of a compound according to the present invention refers to the 0-0 band of a phosphorescence spectrum. The 0-0 band of the phosphorescence spectrum can be determined via the following measurement method. Namely, a compound to be determined is dissolved in well-deoxidized methylene chloride and placed in a phosphorescence-measuring cell, followed by irradiation of excitation light at room temperature (25° C.) to determine an emission spectrum.

For a compound insoluble in the above solvent system, any appropriate solvent capable of dissolving the compound may optionally be used.

Subsequently, a method of determining the 0-0 band is described. In the present invention, the 0-0 band is defined as the maximum emission wavelength appearing in the shortest wavelength portion in the phosphorescence spectrum chart obtained via the above measurement method.

Further, in cases in which the phosphorescence spectrum is weak, a peak wavelength may be read by separating the peak from noise via smoothing processing. Incidentally, the Savitzky-Golay smoothing method may be applied to the smoothing processing.

<<Fluorescence-Emitting Compounds>>

Fluorescence-emitting compounds used in the present invention will now be described.

The emission region of the present invention may contain the above common host material, and in addition, a host compound exhibiting the maximum fluorescence wavelength as a common host material. In this case, via energy transfer from a phosphorescence-emitting compound and another host compound to a fluorescent compound, emission from the host compound exhibiting the maximum fluorescence wavelength is added to electroluminescence as an organic EL element. The host compound exhibiting the maximum fluorescence wavelength is preferably one exhibiting a high fluorescence quantum yield in a solution state. Herein, the fluorescence quantum yield is preferably at least 10%, but specifically, preferably at least 30%. A specific host compound exhibiting the maximum fluorescence wavelength includes a coumarin dye, a pyrane dye, a cyanine dye, a chroconium dye, a squalium dye, an oxobenzanthracene dye, a fluorescein dye, a rhodamine dye, a pyrylium dye, a perylene dye, a stilbene dye, and a polythiophene dye. The fluorescence quantum yield can be determined via a method described in page 362 of Bunko II of Dai 4 Han Jikken Kagaku Koza 7 (Spectroscopy II of 4th Edition Lecture of Experimental Chemistry 7) (1992, published by Maruzen Co., Ltd.).

Figure 4:
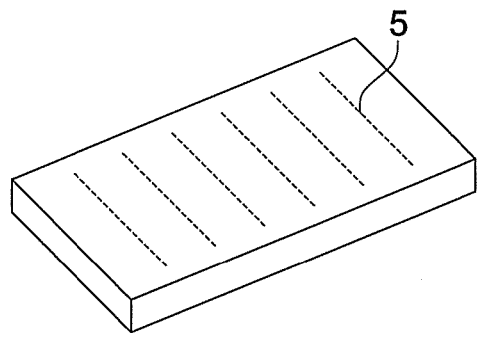
FIG. 4 is a schematic drawing of a full color display device according to a passive matrix mode.
Figure 4:
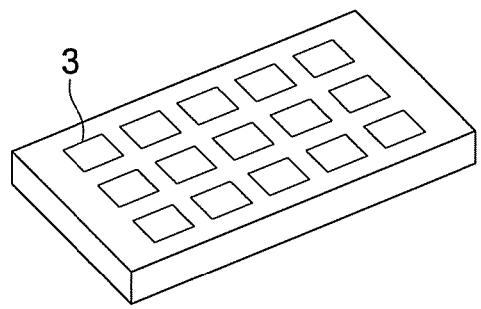
Figure 4:
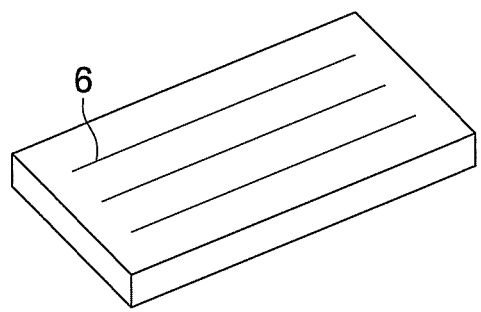
Figure 5:
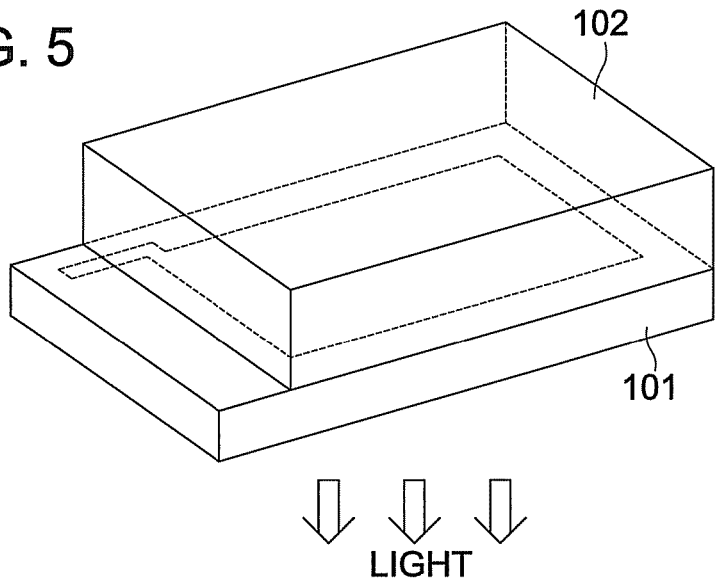
FIG. 5 is a schematic drawing of a lighting device.
Figure 6:
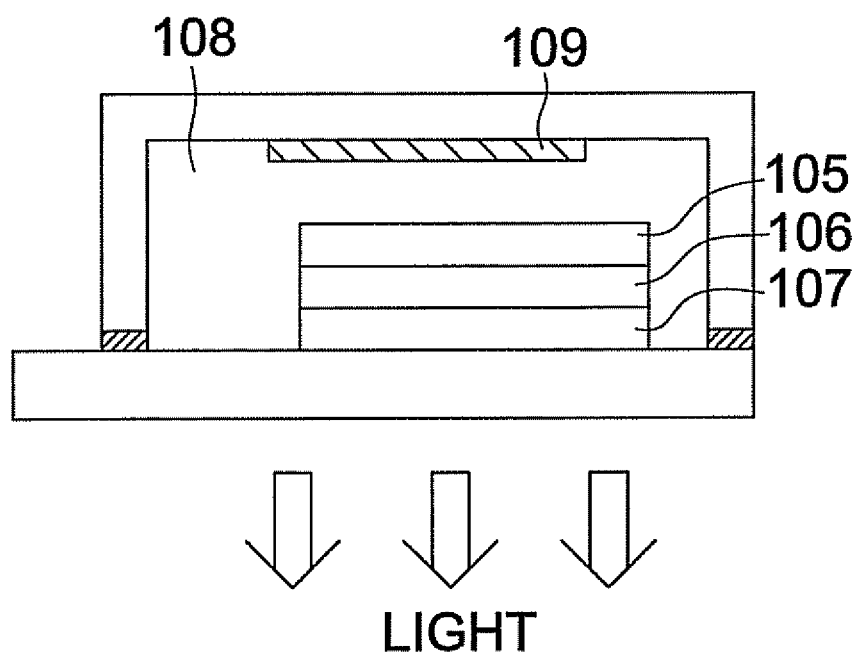
FIG. 6 is a schematic cross-sectional view of a lighting device.

Color of light emitted from the organic EL element of the present invention or from the compound according to the present invention is determined by applying a value measured using spectroradiometer CS-1000 (produced by Minolta Co., Ltd.) to the CIF chromaticity diagram shown in FIG. 4.16 on page 108 of "Shinpen Shikisai Kagaku Handbook" (Coloring Science Handbook, New Edition) (edited by Nihon Shikisai Gakkai, published by Todai Shuppan Kai).

<<Non-Emitting Intermediate Layer>>

In the organic electroluminescent element of the present invention, an organic layer is sandwiched between an anode and a cathode, and the organic layer incorporates at least two layers composed of an emission layer A and an emission layer B. The emission layer A and the emission layer B may be arranged either adjacently or separately. In cases in which the emission layer A and the emission layer B are adjacently arranged each other, a non-emitting intermediate layer (also referred to as an intermediate layer containing no emission dopant) is preferably arranged between the emission layer A and the emission layer B both of which are adjacent.

Arrangement of the inter mediate layer makes it possible to readily control the injection of carriers into the emission layers and further to prevent color shift. As a material used for the intermediate layer, any appropriate material known in the art is employable. Further, when the intermediate layer contains a material similar to an emission host compound, interlayer adhesion can be improved; a carrier injection barrier can be reduced; and a driving voltage can be lowered.

(The Layer Thickness of the Non-Emitting Intermediate Layer)

From the viewpoint of increasing the taking-out quantum efficiency of the organic electroluminescent element as well as of adequately exerting a carrier control function, the thickness of the intermediate layer needs to be controlled preferably in the range of at most 15 nm, more preferably of 3 nm-12 nm, specifically, preferably of 5 nm-9 nm.

<Positive Hole Transport Layer>

A positive hole transport layer contains a material having a function of transporting a positive hole, and in a broad meaning, a positive hole injection layer and an electron inhibition layer are also included in a positive hole transport layer. A single layer of or plural layers of a positive hole transport layer may be provided.

A positive hole transport material is not specifically limited and can be arbitrary selected from those such as generally utilized as a charge injection transporting material of a positive hole in a conventional photoconductive material and those which are well known in the art and utilized in a positive hole injection layer and a positive hole transport layer of an EL element.

A positive hole transport material is those having any one of a property to inject or transport a positive hole or a barrier property to an electron, and may be either an organic substance or an inorganic substance. For example, listed are a triazole derivative, an oxadiazole derivative, an imidazole derivative, a polyallylalkane derivative, a pyrazolone derivative, a phenylenediamine derivative, a allylamine derivative, an amino substituted chalcone derivative, an oxazole derivatives, a styrylanthracene derivative, a fluorenone derivative, a hydrazone derivative, a stilbene derivative, a silazane derivative, an aniline type copolymer, or conductive polymer oligomer and specifically preferably such as thiophene oligomer.

As a positive hole transport material, those described above can be utilized, however, it is preferable to utilized a porphyrin compound, an aromatic tertiary amine compound and a styrylamine compound, and specifically preferably an aromatic tertiary amine compound.

Typical examples of an aromatic tertiary amine compound and a styrylamine compound include N,N,N',N'-tetraphenyl-4,4'-diaminophenyl; N,N'-diphenyl-N,N'-bis(3-methylphenyl)-(1,1'-biphenyl)-4,4'-diamine (TDP); 2,2-bis(4-di-p-tolylaminophenyl)propane; 1,1-bis(4-di-p-tolylaminophenyl)cyclohexane; N,N,N'-tetra-p-tolyl 4,4'-diaminobiphenyl; 1,1-bis(4-di-p-tolylaminophenyl)-4-phenylcyclohexane; bis(4-dimethylamino-2-methyl)phenylmethane; bis(4-di-p-tolylaminophenyl)phenylmethane; N,N'-diphenyl-N,N'-di(4-methoxyphenyl)-4,4'-diaminobiphenyl; N,N,N',N'-tetraphenyl-4,4'-diaminophenylether; 4,4'-bis(diphenylamino)quarterphenyl; N,N,N-tri(p-tolyl)amine; 4-(di-p-tolylamino)-4'-[4-(di-p-triamino)styryl]stilbene; 4-N,N-diphenylamino-(2-diphenylvinyl)benzene; 3-methoxy-4'-N,N-diphenylaminostilbene; and N-phenylcarbazole, in addition to those having two condensed aromatic rings in a molecule described in U.S. Pat. No. 5,061,569, such as 4,4'-bis[N-(1-naphthyl)-N-phenylamino]biphenyl (NDP), and 4,4',4''-tris[N-(3-methylphenyl)-N-phenylamino]triphenylamine (MDTDATA), in which three of triphenylamine units are bonded in a star burst form, described in JP-A 4-308688.

Polymer materials, in which these materials are introduced in a polymer chain or constitute the main chain of polymer, can be also utilized.

Further, an inorganic compound such as a p type-Si and a p type-SiC can be utilized as a positive hole injection material and a positive hole transport material This positive hole transport layer can be prepared by forming a thin layer made of the above-described positive hole transport material according to a method well known in the art such as a vacuum evaporation method, a spin coating method, a cast method, an inkjet method and a LB method. The layer thickness of a positive hole transport layer is not specifically limited, however, is generally 5 nm-5,000 nm. This positive transport layer may have a single layer structure comprised of one or not less than two types of the above described materials.

Further, an impurity-doped positive hole transport layer exhibiting high p-characteristics may be used. Examples thereof include those described in JP-A Nos. 4-297076, 2000-196140, and 2001-102175, as well as J. Appl. Phys., 95, 5773 (2004).

In the present invention, such a positive hole transport layer exhibiting high p-characteristics is preferably used to produce a low-power-consuming element.

<Electron Transport Layer>

An electron transfer layer is comprised of a material having a function to transfer an electron, and an electron injection layer and a positive hole inhibition layer are included in an electron transfer layer in a broad meaning. A single layer or plural layers of an electron transfer layer may be provided.

In the past, when a mono or plural electron transport layers are arranged in the position nearer to the cathode with respect to an emission layer, the compounds shown in the followings have been known as an electron transfer material (also used as a positive hole preventing material). An electron transfer layer is provided with a function to transmit an electron injected from a cathode to an emission layer, and compounds conventionally well known in the art can be utilized by arbitrarily selection as a material thereof.

Examples of a material utilized in this electron transfer layer (hereinafter, referred to as an electron transfer material) include such as a nitro-substituted fluorene derivative, a diphenylquinone derivative, a thiopyradineoxide derivative, a heterocyclic tetracarbonic acid anhydride such as naphthaleneperylene, carbodiimide, a fluorenylidenemethane derivative, anthraquinonedimethane and anthrone derivatives, and an oxadiazole derivative. Further, a thiazole derivative in which an oxygen atom in the oxadiazole ring of the above-described oxadiazole derivative is substituted by a sulfur atom, and a quinoxaline derivative having a quinoxaline ring which is known as an electron attracting group can be utilized as an electron transfer material.

Polymer materials, in which these materials are introduced in a polymer chain or these materials form the main chain of polymer, can be also utilized.

Further, a metal complex of a 8-quinolinol derivative such as tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum and bis(8-quinolinol)zinc (Znq); and metal complexes in which a central metal of the aforesaid metal complexes is substituted by In, Mg, Cu, Ca, Sn, Ga or Pb, can be also utilized as an electron transfer material. Further, metal-free or metal phthalocyanine, or those the terminal of which is substituted by an alkyl group and a sulfonic acid group, can be preferably utilized as an electron transfer material. Further, distyrylpyrazine derivative, which has been exemplified as a material of an emission layer, can be also utilized as an electron transfer material, and, similarly to the case of a positive hole injection layer and a positive hole transfer layer, an inorganic semiconductor such as an n-type-Si and an n-type-SiC can be also utilized as an electron transfer material.

This electron transport layer can be prepared by forming a thin layer made of the above-described electron transport material according to a method well known in the art such as a vacuum evaporation method, a spin coating method, a cast method, an inkjet method and a LB method. The layer thickness of an electron transport layer is not specifically limited; however, is generally 5-5,000 nm. This electron transport layer may have a single layer structure comprised of one or not less than two types of the above described materials.

An electron transport layer containing a doped impurity and having a high n-property can be used. Examples are shown in JP-A 04-297076, 2000-196140, 2001-102175, and J. Appl. Phys., 95, 5773 (2004).

In the present invention, it is preferable to use an electron transport layer having a high n-property for achieving an element to be driven with a low electric power consumption.

<<Display Devices and Lighting Devices>>

The organic EL element of the present invention may be used as one type of lamp for such as lighting and an exposure light source and may also be used as in a type of projector to project images, as well as a type of display device (display) for direct viewing of still or moving images. A driving method in cases of being used as a display device for reproducing moving images may be either a simple matrix (a passive matrix) type or an active matrix type. In addition, a full-color display device may be produced by using at least three types of the organic EL elements of the present invention, each of which emits light of a different color. Alternatively, it is possible that full colorization is realized by separating one emission color, for example, white emission color into blue, green, and red color using appropriate color filters. Further, it is possible to realize full colorization via conversion of an organic El emission color into another color using appropriate color conversion filters. However, in this case, the λmax of the organic EL emission is preferably at most 480 nm.

When a direct-current voltage is applied to a multicolor display device thus produced, emission can be observed via application of a voltage of about 2V-about 40 V, setting the anode as positive polarity and the cathode as negative polarity. An alternating-current voltage may optionally be applied. Incidentally, any appropriate waveform of the applied alternating current may be employed.

The display device of the present invention may be used as a display device, a display, as well as various emission light sources. In the display device and the display, display in full color can be realized using three types of organic EL elements, each of which emits blue, red, and green light.

Examples of the display device and the display include a television set, a personal computer, a mobile device, AV equipment, a teletext broadcasting display, and an in-car information display. Specifically, it is also possible to be used as a display device to reproduce still or moving images. In cases of being used as the display device to reproduce moving images, the driving method may be either a simple matrix (a passive matrix) type or an active matrix type.

Examples of the lighting device of the present invention include household lighting, car-interior lighting, backlights for watches or liquid crystals, light sources for advertising billboards, signal systems, and optical memory media, as well as light sources for electrophotographic copiers, optical telecommunication processors, and optical sensors, without however being limited thereto.

The organic EL element of the present invention may be used as an organic EL element provided with a resonator structure.

Application purposes of such an organic EL element featuring a resonator structure include light sources for optical memory media, electrophotographic copiers, optical telecommunication processors, and optical sensors, without however being limited thereto. Further, the organic EL element may be used for any appropriate cases of the above applications via laser oscillation.

In the following, one example of a display device provided with an organic EL element of this invention will be explained.

FIG. 1 is a schematic drawing to show an example of a display device constituted of an organic EL element. It is a schematic drawing of a display, which displays image information by emission of an organic EL element, such as a mobile phone.

Display 1 is constituted of such as display section A having plural number of pixels and control section B which performs image scanning of display section A based on image information.

Control section B, which is electrically connected to display section A, sends a scanning signal and an image data signal to plural number of pixels based on image information from the outside and pixels of each scanning line successively emit depending on the image data signal by a scanning signal to perform image scanning, whereby image information is displayed on display section A.

Figure 2:
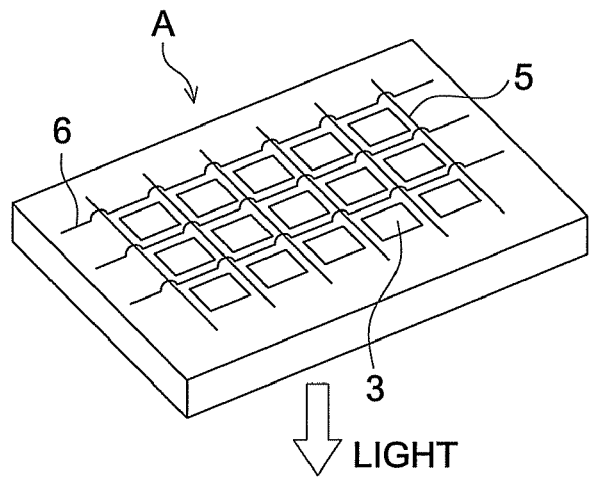
FIG. 2 is a schematic drawing of display section A.

FIG. 2 is a schematic drawing of display section A.

Display section A is provided with such as a wiring part, which contains plural scanning lines 5 and data lines 6, and plural pixels 3 on a substrate. Primary part materials of display section A will be explained in the following. In the drawing, shown is the case that light emitted by pixel 3 is taken out along the white allow (downward).

Scanning lines 5 and plural data lines 6 in a wiring part each are comprised of a conductive material, and scanning lines 5 and data lines 6 are perpendicular in a grid form and are connected to pixels 3 at the right-angled crossing points (details are not shown in the drawing).

Pixel 3 receives an image data from data line 6 when a scanning signal is applied from scanning line 5 and emits according to the received image data. Full-color display device is possible by appropriately arranging pixels having an emission color in a red region, pixels in a green region and pixels in a blue region, side by side on the same substrate.

Next an emission process of a pixel will be explained.

Figure 3:
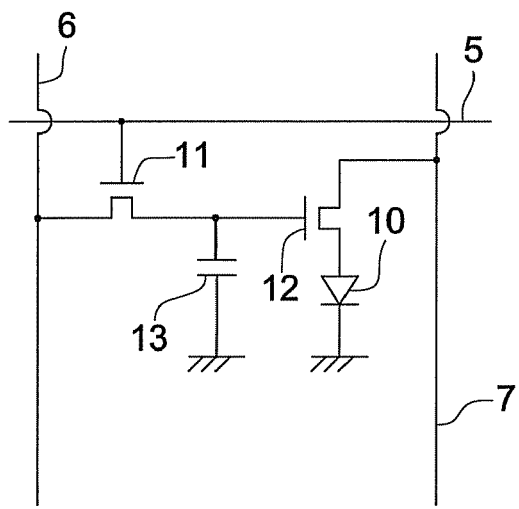
FIG. 3 is an equivalent circuit diagram of an image pixel.

FIG. 3 is a schematic drawing of a pixel.

A pixel is equipped with such as organic EL element 10, switching transistor 11, operating transistor 12 and capacitor 13. Red, green and blue emitting organic EL elements are utilized as organic EL element 10 for plural pixels, and full-color display device is possible by arranging these side by side on the same substrate.

In FIG. 3, an image data signal is applied on the drain of switching transistor 11 via data line 6 from control section B. Then, when a scanning signal is applied on the gate of switching transistor 11 via scanning line 5 from control section B, operation of switching transistor is on to transmit the image data signal applied on the drain to the gates of capacitor 13 and operating transistor 12.

Operating transistor 12 is on, simultaneously with capacitor 13 being charged depending on the potential of an image data signal, by transmission of an image data signal. In operating transistor 12, the drain is connected to electric source line 7 and the source is connected to the electrode of organic EL element 10, and an electric current is supplied from electric source line 7 to organic EL element 10 depending on the potential of an image data applied on the gate.

When a scanning signal is transferred to next scanning line 5 by successive scanning of control section B, operation of switching transistor 11 is off. However, since capacitor 13 keeps the charged potential of an image data signal even when operation of switching transistor 11 is off, operation of operating transistor 12 is kept on to continue emission of organic EL element 10 until the next scanning signal is applied. When the next scanning signal is applied by successive scanning, operating transistor 12 operates depending on the potential of an image data signal synchronized to the scanning signal and organic EL element 10 emits.

That is, emission of each organic EL element 10 of plural pixels 3 is performed by providing switching transistor 11 and operating transistor 12 against each organic EL element 10 of plural pixels 3. Such an emission method is called as an active matrix mode.

Herein, emission of organic EL element 10 may be either emission of plural gradations based on a multiple-valued image data signal having plural number of gradation potentials or on and off of a predetermined emission quantity based on a binary image data signal.

Further, potential hold of capacitor 13 may be either continuously maintained until the next scanning signal application or discharged immediately before the next scanning signal application.

In this invention, emission operation is not necessarily limited to the above-described active matrix mode but may be a passive matrix mode in which organic EL element is emitted based on a data signal only when a scanning signal is scanned.

FIG. 4 is a schematic drawing of a display device based on a passive matrix mode. In FIG. 4, plural number of scanning lines 5 and plural number of image data lines 6 are arranged grid-wise, opposing to each other and sandwiching pixels 3.

When a scanning signal of scanning line 5 is applied by successive scanning, pixel 3 connected to scanning line 5 applied with said signal emits depending on an image data signal. Since pixel 3 is provided with no active element in a passive matrix mode, decrease of manufacturing cost is possible.

An organic EL element material of this invention can be also applied to an organic EL element to generate emission of practically white color as a lighting device. Plural emission colors are simultaneously emitted by plural number of emission materials to obtain white light by mixing colors. A combination of plural emission colors may be either the one, in which three emission maximum wavelengths of three primary colors of blue, green and red are contained, or the other, in which two emission maximum wavelengths, utilizing a relationship of complimentary colors such as blue and yellow, or blue and orange, are contained.

Further, a combination of emission materials to obtain plural number of emission colors may be either a combination comprising plural number of materials which emit phosphoresce or fluorescence, or a combination of a material which emits phosphoresce or fluorescence and a dye material which emits by light from an emission material as exiting light, however, in a white organic electroluminescent element according to this invention, it is preferable to mix plural emission dopants in combination.

Examples of the layer constitution of an organic electroluminescent element to realize plural emission colors include a method of allowing plural emission dopants to be present in one emission region, a method of allowing one of the plural dopants exhibiting different emission wavelengths to be present in each of the emission regions, and a method of forming minute pixels, which emit light at different wavelengths, in a matrix form.

In the white organic EL element of the present invention, it is also possible to employ metal masking or patterning using ink-jet printing during layer production, as appropriate. In cases in which patterning is applied, patterning may be employed for whichever one of only an electrode, an electrode and an emission region, or the entire element layer.

An emission material utilized in an emission layer is not specifically limited, and in the case of a backlight of a liquid crystal display element, any combination by arbitrary selection among platinum complexes according to this invention or emission materials well known in the art can be utilized so as to be fitted to the wavelength range corresponding to CF (color filter) characteristics, whereby white emission can be obtained.

In this manner, a white emitting organic EL element of this invention is usefully utilized as one type of a lamp such as a home use illumination, a car room illumination or an exposure light source as various emission light sources or lighting devices, in addition to the aforesaid display device and a display, and is further usefully applied for a display as such as a backlight of a liquid crystal display.

In addition to these, listed is a wide range of applications such as a backlight of a watch, an advertising board, a signal, a light source of an optical memory medium, a light source of an electrophotographic copier, a light source of an optical telecommunication processor and a light source of an optical sensor, and further general home use electric instruments which require a display device.

EXAMPLES
The present invention will now be described with reference to examples that by no means limit the scope of the present invention. Further, the compounds used in the examples are listed below.
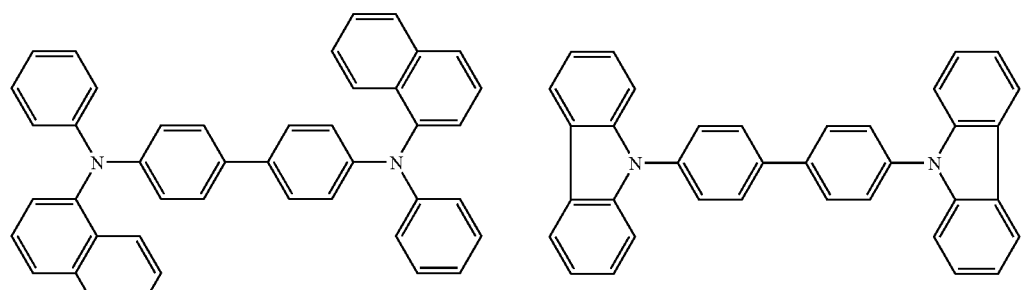
α-NPD
CPB
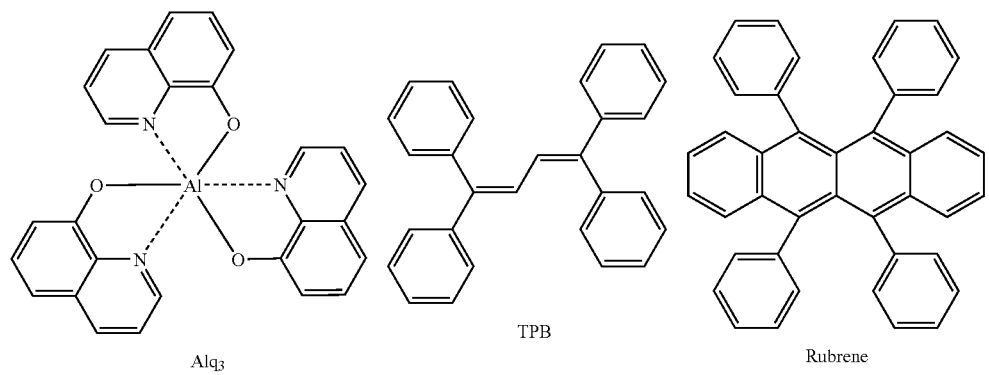
Alq₃
TPB
Rubrene
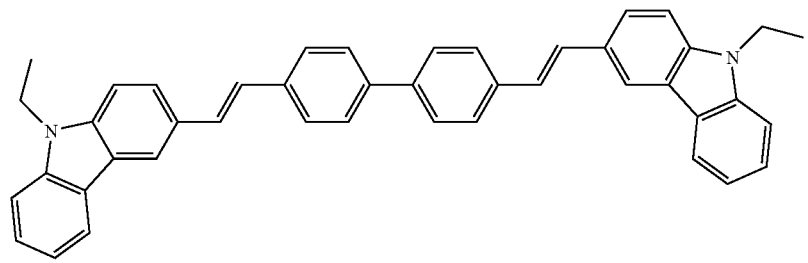
BCzVBi
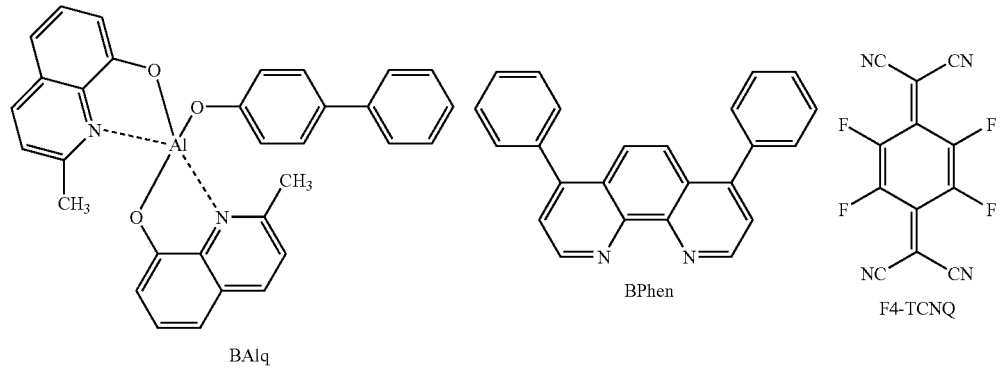
BAlq
BPhen
F4-TCNQ

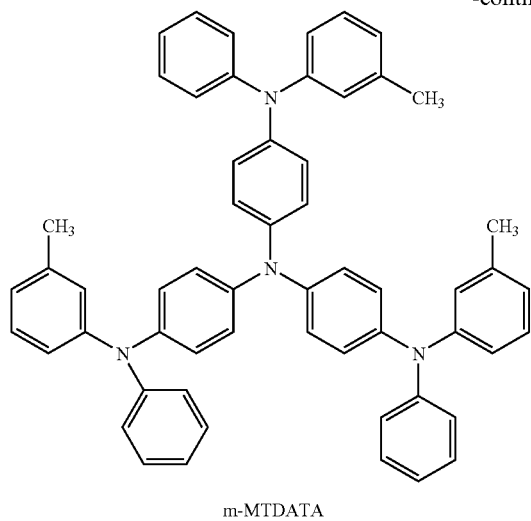

m-MTDATA

Example 1

Production of White-Light Emitting Organic EL Element 1-1

A substrate (NA45, produced by NH Techno Glass Corp.), prepared by depositing ITO (indium tin oxide) at a 100 nm thickness on a glass plate of a size of 100×100×1.1 mm serving as an anode, was subjected to patterning, and a transparent support substrate provided with this ITO transparent electrode was cleaned with isopropyl alcohol via ultrasonic waves, followed by being dried using dry nitrogen and cleaned using UV ozone for 5 minutes. This transparent support substrate was fixed onto a substrate holder in a common vacuum deposition apparatus available on the market. On the other hand, there was individually placed one of the following materials in resistance heating boats, made of molybdenum: 200 mg of copper phthalocyanine (CuPc), 200 mg of α-NPD, 200 mg of CBP, 200 mg of H-15, 100 mg of Ir-1, 100 mg of D-1, 100 mg of Ir-14, 200 mg of H-17, and 200 mg of BAlq.

Subsequently, the constituent layer of the white light-emitting organic EL element was prepared via the following steps.

(a) A vacuum chamber was depressurized to $4×10^{-4}$ Pa and the heating boat containing CuPc was electrically heated to form a positive hole injection layer of a 30 nm thickness via deposition thereof onto the transparent support substrate at a deposition rate of 0.1 nm/second.

(b) The heating boat containing α-NPD was electrically heated to form a positive hole transport layer of a 40 nm thickness via deposition thereof onto the positive hole injection layer at a deposition rate of 0.1 nm/second.

(c) The two heating boats individually containing, either of CBP and Ir-1 were electrically heated at the same time to form emission layers 1, featuring the weight ratios and the layer thicknesses listed in. Table 1, via codeposition thereof onto the positive hole transport layer.

(d) The heating boat containing H-15 was electrically heated to form a non-emitting intermediate layer of a 7 nm thickness via deposition thereof onto emission layers 1 at a deposition rate of 0.1 nm/second.

(e) The three heating boats individually containing one of H-15, D-1, and Ir-14 were electrically heated at the same time to form emission layers 2, featuring the weight ratios and the layer thicknesses listed in Table 1, via three-way codeposition thereof onto the non-emitting intermediate layer.

The heating boat containing H-17 was electrically heated to form a positive hole inhibition layer of a 10 nm thickness via deposition thereof onto emission layers 2 at a deposition rate of 0.1 nm/second.

(f) The heating boat containing BAlq was electrically heated to form an electron transport layer of a 30 nm thickness via deposition thereof onto the positive hole inhibition layer at a deposition rate of 0.1 nm/second.

Herein, the substrate temperature during deposition was room temperature.

(g) Lithium fluoride was deposited to form a cathode buffer layer of a 0.5 nm thickness, and then a cathode of a 110 nm thickness was formed by depositing aluminum to prepare White Light-emitting Organic EL Element 1-1.

Production of White-Light Emitting Organic EL Elements 1-2-1-11

White-light Emitting Organic EL Elements 1-2-1-11 were prepared in the same manner as for White-light Emitting Organic EL Element 1-1 except that the emission layer constitutions in production of White-light Emitting Organic EL Element 1-1 were changed to the ones listed in Table 1.

Production of White-Light Emitting Organic EL Elements 1-12 and 1-13 as Comparative Examples White-light Emitting Organic EL Elements 1-12 and 1-13 were prepared in the same manner as for White-light Emitting Organic EL Element 1-1 except that the emission layer constitutions in White-light Emitting Organic EL Element 1-1 were changed to the ones listed in. Table 1.

TABLE 1

| White Organic EL Element | Emission Layer 1 | Intermediate Layer | Emission Layer 2 | Remarks |
|---|---|---|---|---|
| 1-1 | CBP:Ir-1 (1% by weight) 5 nm | H-15 | H-15:D-1 (6% by weight):Ir-14 (0.1% by weight) 40 nm | Inv. |
| 1-2 | H-14:Ir-1 (1% by weight) 7 nm | H-14 | H-14:D-1 (6% by weight):Ir-14 (0.1% by weight) 40 nm | Inv. |
| 1-3 | H-15:Ir-1 (1% by weight) 5 nm | H-15 | H-15:D-1 (6% by weight):Ir-14 (0.1% by weight) 40 nm | Inv. |
| 1-4 | H-16:Ir-1 (1% by weight) 5 nm | H-16 | H-16:D-1 (6% by weight):Ir-14(0.1% by weight) 40 nm | Inv. |
| 1-5 | H-15:Ir-1 (1% by weight) 5 nm | H-15:H-16 (weight ratio 1:1) | H-15:D-1(6% by weight):Ir-14 (0.1% by weight) 40 nm | Inv. |
| 1-6 | H-15:Ir-14 (1% by weight) 3 nm | H-15 | H-15:D-1 (6% by weight):Ir-14 (0.1% by weight) 40 nm | Inv. |
| 1-7 | H-15:Ir-1 (1% by weight) 3 nm | BAlq | H-15:D-1 (6% by weight):Ir-14 (0.1% by weight) 40 nm | Inv. |
| 1-8 | H-15:Ir-1 (4% by weight) 10 nm | — | H-15:D-1 (6% by weight):Ir-14 (0.1 by weight) 40 nm | Inv. |
| 1-9 | H-15:Ir-1 (1% by weight):BCzVBi (2% by weight) 10 nm | H-15 | H-15:D-1 (6% by weight):Ir-14(0.1% by weight) 40 nm | Inv. |
| 1-10 | CBP:Ir-1 (1% by weight):Ir-15 (1% by weight) 7 nm | — | H-15:D-1 (6% by weight):Ir-14 (0.1% by weight) 40 nm | Inv. |
| 1-11 | H-15:Ir-1 (1% by weight):Ir-15 (1% by weight) 5 nm | H-15 | H-15:D-1 (6% by weight):Ir-14 (0.1% by weight) 40 nm | Inv. |
| 1-12 | H-15:Ir-14 (9% by weight) 20 nm | | H-15:D-1 (6% by weight) 20 nm | Comp. |
| 1-13 | H-15:TPB (3% by weight) 20 nm | | Alq$_3$:Rubrene (2% by weight) 20 nm | Comp. |

Inv.: Present Invention,
Comp.: Comparative Example

Herein, the term "% by weight" expressed for emission layer 1 and emission layer 2 in Table 1 is described below.

For example, in White Light-emitting Organic EL Element 1-1 of Table 1, the materials for emission layer 1 is described as CBP:Ir-1 (1% by weight) 5 nm.

The above description shows that CBP and Ir-1 account for 99% by weight and 1% by weight, respectively, of the total weight of emission layer 1 and also the layer thickness of emission layer 1 is expressed as 5 nm.

Similarly, it is shown that H-15, D-1, and Ir-1 account for 93.9% by weight, 6% by weight, and 0.1% by weight, respectively, of the total weight of emission layer 2.

This expression manner is similarly applied to other Organic Electroluminescent Elements 1-2-1-1-13.

Evaluation of White Light-Emitting Organic EL Elements 1-1-1-13 prepared was conducted via the following methods.

<<Taking-Out Quantum Efficiency>>

The taking-out quantum efficiencies (%) of the thus-prepared white light-emitting El elements were determined at 23° C. under a dry nitrogen ambience by applying a constant current of 2.5 mA/cm$^2$. Herein, determination was carried out using a spectroradiometer CS-1000 (produced by Konica Minolta).

<<Chromaticity Shift>>

A chromaticity shift represents a shift in chromaticity coordinates between at luminances of 100 cd/m$^2$ and 5000 cd/m$^2$ in the CIF chromaticity diagram. Herein, determination was carried out at 23° C. under a dry nitrogen ambience using a spectroradiometer CS-1000 (produced by Konica Minolta).

<<Emission Life>>

When an organic EL element was driven at a constant current of 2.5 mA/cm$^2$, a period of time required while the luminance thereof decreased to a half of the luminance immediately after emission (the initial luminance) was measured. Then, the period of time was designated as the half-life ($\tau 0.5$), serving as an indicator of the life. Herein, determination was carried out using a spectroradiometer CS-1000 (produced by Konica Minolta).

The obtained results are listed in Table 2. Herein, the determined results of the taking-out quantum efficiency and the emission life listed in Table 2 are expressed as the relative values when the determined values of White Light-emitting Organic EL Element 1-12 is designated as 100.

TABLE 2

| White Organic EL Element | Chromaticity Shift | Emission Life | Taking-out Quantum Efficiency | Remarks |
|---|---|---|---|---|
| 1-1 | 0.008 | 195 | 125 | Present Invention |
| 1-2 | 0.01 | 190 | 142 | Present Invention |
| 1-3 | 0.005 | 215 | 138 | Present Invention |
| 1-4 | 0.008 | 220 | 130 | Present Invention |
| 1-5 | 0.007 | 210 | 133 | Present Invention |
| 1-6 | 0.009 | 205 | 127 | Present Invention |
| 1-7 | 0.01 | 180 | 120 | Present Invention |
| 1-8 | 0.03 | 170 | 112 | Present Invention |
| 1-9 | 0.007 | 208 | 118 | Present Invention |
| 1-10 | 0.02 | 172 | 110 | Present Invention |
| 1-11 | 0.005 | 213 | 122 | Present Invention |

TABLE 2-continued

| White Organic EL Element | Chromaticity Shift | Emission Life | Taking-out Quantum Efficiency | Remarks |
|---|---|---|---|---|
| 1-12 | 0.11 | 100 | 100 | Comparative Example |
| 1-13 | 0.13 | 120 | 58 | Comparative Example |

Table 2 shows that White Light-emitting Organic EL Elements 1-1-1-11 of the present invention excels in all the items of chromaticity shift, emission life, and taking-out quantum efficiency, compared with those of White Light-emitting Organic EL Elements 1-12 and 1-13 serving as Comparative Examples.

Example 2

Production of White Light-Emitting Organic EL Elements 2-1-2-11

White Light-emitting Organic EL Elements 2-1-2-11 were prepared in the same manner as for White Light-emitting Organic EL Elements 1-1-1-11 except that CuPc and BAlq, used in preparation of White Light-emitting Organic EL Elements 1-1-1-11, were each exchanged to an m-MTDATA:F4-TCNQ (weight ratio 991) codeposition layer and a BPhen:Cs (weight ratio 75:25) codeposition layer, and also LiF was not deposited.

It was found that the driving voltage of each of thus-prepared White Light-emitting Organic EL Elements 2-1-2-11 decreased by 3V-6V, compared with corresponding White Light-emitting Organic EL Elements 1-1-1-11.

Example 3

Preparation of an Image Display Device Using a White Light-Emitting Organic EL Element An image display device, prepared by covering the non-emission side of White Light-emitting Organic EL Element 1-3, having been prepared in Example 1, with a glass case and by attaching a color filter to the emission side thereof, was found to exhibit preferable full-color display performance, enabling employment as an excellent image display device.

Example 4

Preparation of a Lighting Device Using a White Light-Emitting Organic EL Element A lighting device was prepared by covering the non-emission side of White Light-emitting Organic EL Element 1-3, having been prepared in Example 1, with a glass case. The lighting device was found to be employable as a thin-type lighting device, emitting white light and exhibiting high emission efficiency.

The invention claimed is:

1. An organic electroluminescent element comprising organic layers sandwiched between an anode and a cathode, wherein the organic layers incorporates an emission layer A containing a host compound A and at least two types of emission dopants, and an emission layer B containing a host compound B and at least two types of emission dopants, provided that at least one of the emission dopants contained in the emission layer A is a phosphorescence-emitting material.

2. The organic electroluminescent element of claim 1, wherein the emission layer B contains one type of emission dopant.

3. The organic electroluminescent element of claim 1, wherein the emission layer A contains a blue light-emitting dopant.

4. The organic electroluminescent element of claim 1, wherein the emission layer B is located in a position nearer to the anode than the emission layer A; and the emission layer A is located in a position nearer to the cathode than the emission layer B.

5. The organic electroluminescent element of claim 1, wherein the emission layer A and the emission layer B each contain an identical emission dopant.

6. The organic electroluminescent element of claim 1, wherein the organic layers contain at least three types of emission dopants: a blue light-emitting dopant; a green light-emitting dopant; and a red light-emitting dopant, provided that, of the three types of the emission dopants, at least two types are contained in the emission layer A and at least one type is contained in the emission layer B.

7. The organic electroluminescent element of claim 1, wherein the emission layer B contains a red light-emitting dopant A, and the emission layer A contains a red light-emitting dopant B and a blue light-emitting dopant A.

8. The organic electroluminescent element of claim 1, wherein the emission layer A contains a red light-emitting dopant and a blue light-emitting dopant; and the emission layer B contains a green light-emitting dopant.

9. The organic electroluminescent element of claim 1, wherein the emission layer A and the emission layer B each contain an identical host compound.

10. The organic electroluminescent element of claim 1, wherein a non-emitting intermediate layer is arranged between the emission layer A and the emission layer B.

11. The organic electroluminescent element of claim 10, wherein the emission layer A, the emission layer B, and the non-emitting intermediate layer each contain an identical host compound.

12. The organic electroluminescent element of claims 10, wherein the layer thickness of the non-emitting intermediate layer is in the range of 1 nm-15 nm.

13. The organic electroluminescent element of claim 1, wherein a positive hole transport layer containing at least a positive hole transport material and an acceptor is incorporated as a constituent layer.

14. The organic electroluminescent element of claim 1, wherein an electron transport layer containing at least an electron transport material and a donor is incorporated as a constituent layer.

15. The organic electroluminescent element of claim 1, wherein the blue light-emitting dopant has an ionization potential (Ip) of 5.5 eV or less.

16. The organic electroluminescent element of claim 1, wherein the blue light-emitting dopant is a compound having a partial structure represented by Formula (1):

Formula (1)

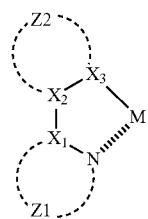

wherein $X_1$, $X_2$, and $X_3$ each represent a carbon atom or a nitrogen atom; Z1 represents a group of atoms forming a 5-membered aromatic heterocycle; Z2 represents a group of atoms forming a 5-membered or 6-membered aromatic heterocycle or a 6-membered aromatic hydrocarbon ring; and M represents Ir or Pt.

17. The organic electroluminescent element of claim 1, wherein the organic electroluminescent element emits a white light.

18. A display device comprising the organic electroluminescent element of claim 1.

19. A lighting device comprising the organic electro luminescent element of claim 1.

* * * * *